US012604708B2

(12) United States Patent
Paeng et al.

(10) Patent No.: US 12,604,708 B2
(45) Date of Patent: *Apr. 14, 2026

(54) ATOMIC LAYER ETCH SYSTEMS FOR SELECTIVELY ETCHING WITH HALOGEN-BASED COMPOUNDS

(71) Applicant: LAM RESEARCH CORPORATION, Fremont, CA (US)

(72) Inventors: Dong Woo Paeng, Albany, CA (US); Yunsang Kim, Monte Sereno, CA (US); He Zhang, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 1380 days.

This patent is subject to a terminal disclaimer.

(21) Appl. No.: 17/291,488

(22) PCT Filed: Nov. 7, 2019

(86) PCT No.: PCT/US2019/060220
§ 371 (c)(1),
(2) Date: May 5, 2021

(87) PCT Pub. No.: WO2020/101997
PCT Pub. Date: May 22, 2020

(65) Prior Publication Data
US 2022/0005740 A1     Jan. 6, 2022

Related U.S. Application Data

(60) Provisional application No. 62/767,564, filed on Nov. 15, 2018.

(51) Int. Cl.
*H10P 50/24*        (2026.01)
*B23K 26/073*       (2006.01)
(Continued)

(52) U.S. Cl.
CPC ........ *H10P 74/238* (2026.01); *B23K 26/0732* (2013.01); *B23K 26/362* (2013.01);
(Continued)

(58) Field of Classification Search
None
See application file for complete search history.

(56) References Cited

U.S. PATENT DOCUMENTS 7,811,910 B2   10/2010  Hongo et al.
9,355,907 B1    5/2016  Lei et al.
(Continued)

FOREIGN PATENT DOCUMENTS

CN      102934208 A     2/2013
CN      112385029 A     2/2021
(Continued)

OTHER PUBLICATIONS

WO-2018074281-A1 Chung et al., Method for manufacturing annealed body, laser anneal base stage, and laser anneal device, Apr. 26, 2018 (Year: 2018).*
(Continued)

*Primary Examiner* — Sylvia MacArthur
*Assistant Examiner* — Michelle Crowell

(57)        ABSTRACT

A substrate processing system includes a processing chamber, a substrate support, a heat source, a gas delivery system and a controller. The substrate support is disposed in the processing chamber and supports a substrate. The heat source heats the substrate. The gas delivery system supplies a process gas to the processing chamber. The controller controls the gas delivery system and the heat source to iteratively perform an isotropic atomic layer etch process including: during an iteration of the isotropic atomic layer etch process, performing pretreatment, atomistic adsorption, and pulsed thermal annealing; during the atomistic adsorp-
(Continued)

tion, exposing a surface of the substrate to the process gas including a halogen species that is selectively adsorbed onto an exposed material of the substrate to form a modified material; and during the pulsed thermal annealing, pulsing the heat source multiple times within a predetermined period to expose and remove the modified material.

32 Claims, 26 Drawing Sheets

(51) Int. Cl.

| | |
|---|---|
| *B23K 26/362* | (2014.01) |
| *H01J 37/32* | (2006.01) |
| *H05B 3/00* | (2006.01) |
| *H10P 34/42* | (2026.01) |
| *H10P 74/00* | (2026.01) |
| *B23K 101/40* | (2006.01) |
| *G02B 26/10* | (2006.01) |
| *G02B 27/09* | (2006.01) |

(52) U.S. Cl.
CPC .. *H01J 37/32449* (2013.01); *H01J 37/32724* (2013.01); *H05B 3/0047* (2013.01); *H10P 34/42* (2026.01); *H10P 50/242* (2026.01); *B23K 2101/40* (2018.08); *G02B 26/101* (2013.01); *G02B 27/0927* (2013.01); *G02B 27/0944* (2013.01); *G02B 27/0955* (2013.01); *H01J 2237/334* (2013.01)

(56) References Cited

U.S. PATENT DOCUMENTS

| | | | | | |
|---|---|---|---|---|---|
| 10,720,334 | B2 * | 7/2020 | Vervuurt | ............. | H01L 21/0337 |
| 11,984,330 | B2 * | 5/2024 | Paeng | .............. | H01J 37/32715 |
| 2004/0040655 | A1 * | 3/2004 | Yuasa | .............. | H01L 21/67092 |
| | | | | | 216/2 |

| | | | | | |
|---|---|---|---|---|---|
| 2005/0170572 | A1 * | 8/2005 | Hongo | ............... | G02B 27/0966 |
| | | | | | 250/341.1 |
| 2009/0323739 | A1 | 12/2009 | Elliott et al. | | |
| 2011/0139748 | A1 * | 6/2011 | Donnelly | .......... | H01J 37/32045 |
| | | | | | 216/37 |
| 2013/0137267 | A1 | 5/2013 | Chang et al. | | |
| 2014/0158674 | A1 * | 6/2014 | Moffatt | ............. | H01L 21/67115 |
| | | | | | 219/385 |
| 2015/0132961 | A1 | 5/2015 | Chang et al. | | |
| 2016/0135274 | A1 * | 5/2016 | Fischer | ............. | H01L 21/67253 |
| | | | | | 250/492.2 |
| 2016/0196969 | A1 * | 7/2016 | Berry, III | .......... | H01L 21/02252 |
| | | | | | 438/694 |
| 2016/0276214 | A1 | 9/2016 | Fu et al. | | |
| 2017/0053808 | A1 * | 2/2017 | Kamp | ................. | H01L 21/3065 |
| 2017/0072505 | A1 | 3/2017 | Moffatt et al. | | |
| 2018/0166296 | A1 * | 6/2018 | Ma | .................... | H01J 37/32422 |
| 2018/0218915 | A1 * | 8/2018 | Kim | ................. | H01L 21/02236 |
| 2018/0233365 | A1 * | 8/2018 | Kim | ........................ | H01J 37/00 |
| 2021/0143032 | A1 * | 5/2021 | Paeng | ...................... | G02F 1/11 |
| 2022/0084838 | A1 * | 3/2022 | Zhang | ................. | H01L 21/6831 |

FOREIGN PATENT DOCUMENTS

| | | | |
|---|---|---|---|
| JP | 2005252186 | A | 9/2005 |
| JP | 2008218862 | A | 9/2008 |
| JP | 2010161107 | A | 7/2010 |
| JP | 2011515021 | A | 5/2011 |
| JP | 2012169632 | A | 9/2012 |
| JP | 2016036020 | A | 3/2016 |

OTHER PUBLICATIONS

International Search Report and Written Opinion of the ISA issued in PCT/US2019/060220, mailed Apr. 9, 2020; ISA/KR.

Office Action issued in corresponding Chinese Patent Application 2019800758299 dated Jun. 26, 2024.

Office Action issued in corresponding Japanese Patent Application 2021-525038 dated Oct. 17, 2023.

* cited by examiner

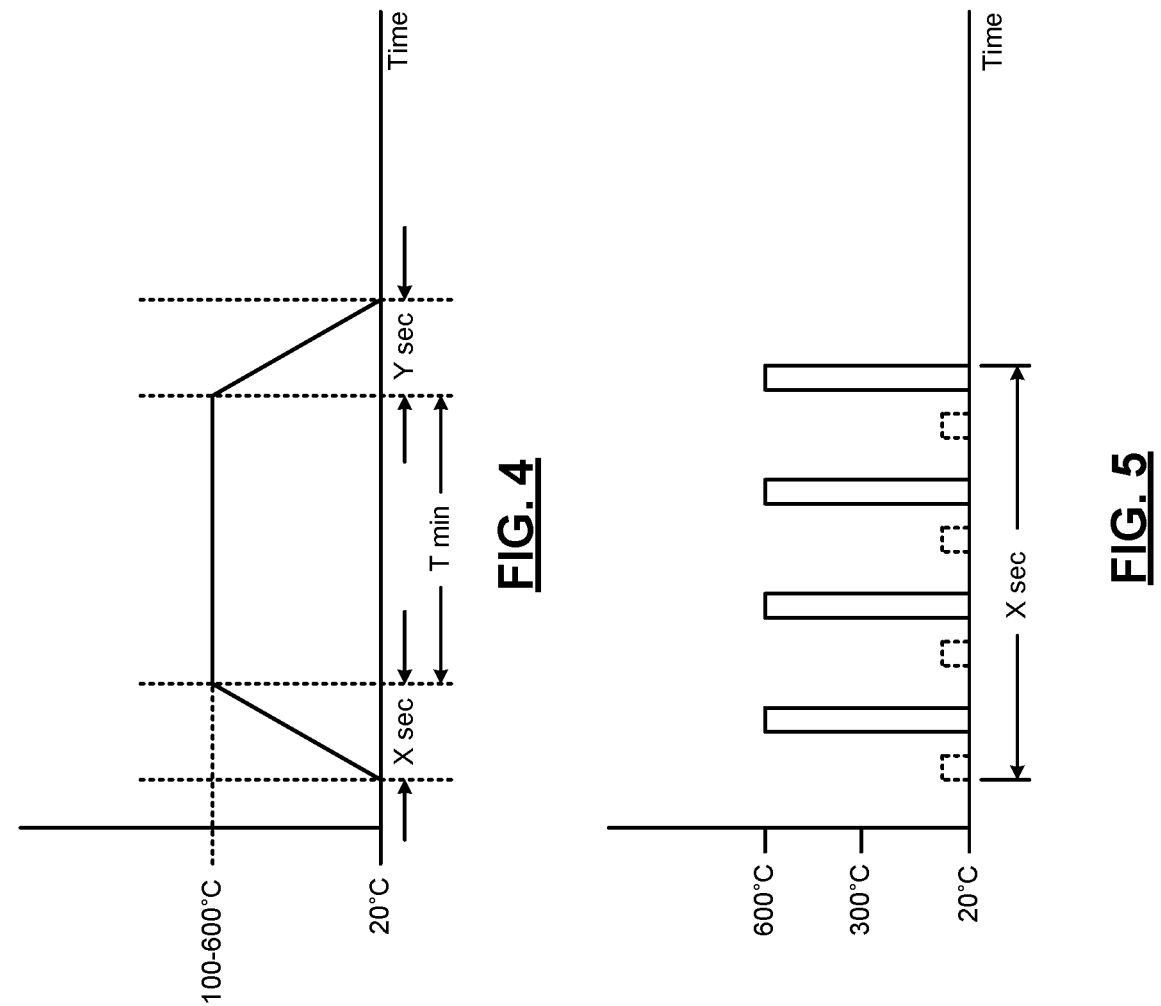

Atomic Force Microscopy Roughness

Key
- Z Range
- Roughness Rq

FIG. 24

ATOMIC LAYER ETCH SYSTEMS FOR SELECTIVELY ETCHING WITH HALOGEN-BASED COMPOUNDS

CROSS-REFERENCE TO RELATED APPLICATIONS

The present disclosure is a U.S. National Phase Application under 35 U.S.C. 371 of International Application No. PCT/US2019/060220, filed on Nov. 7, 2019, which claims the benefit of U.S. Provisional Patent Application No. 62/767,564, filed on Nov. 15, 2018. The entire disclosures of the above-identified applications are hereby incorporated by reference in their entirety.

FIELD

The present disclosure relates to substrate etching and deposition processes, and more particularly to atomic layer etching and deposition.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

During atomic layer etching (ALE) of a substrate, such as a semiconductor wafer, a reactant (e.g., chlorine ($CL_2$) gas) is introduced into a processing chamber to modify a surface of the substrate. A chlorine-based gas is often used during ALE of silicon (Si), germanium (Ge) and metal oxides ($MO_x$) to provide a chlorine infused top layer. As an example, a chlorine gas may be introduced to convert a top portion of a silicon substrate from being formed of Si to being a layer of silicon chloride ($SiCl_x$), where x is 1, 2, 3, or 4. After surface modification, the chlorine gas is purged from the chamber. An argon (Ar) plasma is provided to perform ion bombardment and actively remove the silicon chloride reactive layer followed by purging of by-products.

SUMMARY

A substrate processing system is provided and includes a processing chamber, a substrate support, a heat source, a gas delivery system and a controller. The substrate support is disposed in the processing chamber and is configured to support a substrate. The heat source is configured to heat the substrate. The gas delivery system is configured to supply a first process gas to the processing chamber. The controller is configured to control the gas delivery system and the heat source to iteratively perform an isotropic atomic layer etch process including: during an iteration of the isotropic atomic layer etch process, performing pretreatment, atomistic adsorption, and pulsed thermal annealing; during the atomistic adsorption, exposing a surface of the substrate to the first process gas including a halogen species that is selectively adsorbed onto an exposed material of the substrate to form a modified material; and during the pulsed thermal annealing, pulsing the heat source on and off a plurality of times within a predetermined period to expose and remove the modified material.

In other features, the controller is configured to, during iterations of the pulsed thermal annealing, allow the modified material to cool between consecutive ones of thermal energy pulses of the heat source. In other features, the heat source includes flash lamps. In other features, the substrate processing system further includes a capacitive discharge circuit configured to discharge power to the flash lamps for each of a plurality of thermal energy pulses of the heat source. In other features, the heat source includes a reflector having parabolic reflective portions respectively for the plurality of flash lamps. In other features, the flash lamps include respective cooling jackets.

In other features, the substrate processing system further includes a reflector that is conical-shaped and directs thermal energy from the plurality of flash lamps at the substrate. In other features, the controller is configured to pulse the plurality of flash lamps to be on for a pulse duration of less than 4 milliseconds during at least one iteration of the pulsed thermal annealing.

In other features, the controller is configured to, during at least some of the iterations of the pulsed thermal annealing and via the heat source, heat the modified material of the substrate such that the modified material of the substrate cools down to a temperature of less than 25° C. in less than 0.5 seconds after shutting off the heat source.

In other features, the heat source includes a laser. The laser is configured to generate a laser beam, which is directed at the substrate. In other features, the substrate processing system further includes mirrors and motors. The controller is configured, via the motors, to steer the laser beam by moving the mirrors to span across the substrate. In other features, a diameter of the substrate is 300 mm. The substrate includes dies. The controller is configured to, within the predetermined period, span across and heat each of the dies.

In other features, the predetermined period is one second. The controller is configured to heat each of the plurality of dies individually and a second predetermined number of times. In other features, the substrate processing system further includes a lens circuit configured to shape and direct the laser beam. In other features, the lens circuit includes beam-shaping optics to convert the laser beam from a round-shaped laser beam to a square-shaped laser beam.

In other features, the lens circuit includes: flat-top optics to convert the laser beam from a round-shaped laser beam to a flat-top shaped laser beam; and diffractive optics to convert the flat-top shaped laser beam to a square-shaped laser beam.

In other features, the substrate processing system further includes a mirror module comprising a first mirror, a second mirror, a first motor and a second motor. The controller is configured to move the first mirror and the second mirror via the first motor and the second motor to adjust a position of the laser beam on the substrate.

In other features, the substrate processing system further includes a tele-centric lens assembly comprising a plurality of lenses and configured to direct the laser beam in a direction perpendicular to the surface of the substrate.

In other features, the substrate processing system further includes a mirror module comprising a first mirror, a second mirror, a first motor and a second motor. The laser beam is directed at the first mirror. The laser beam is directed from the first mirror to the second mirror. The laser beam is directed from the second mirror through the tele-centric lens assembly at the substrate. The controller is configured to move the first mirror and the second mirror via the first motor and the second motor to adjust a position of the laser beam on the substrate.

In other features, the processing chamber is an inductively coupled plasma chamber or a remote plasma source connected chamber. The tele-centric lens assembly is disposed above a dielectric window of the processing chamber.

In other features, the substrate processing system further includes a beam size adjustment module configured to adjust a size of the laser beam prior to being received by the substrate. In other features, the processing chamber is void of plasma during the pulsed thermal annealing.

In other features, the controller is configured to set a temperature of an interior of the processing chamber, during one or more iterations of the atomistic adsorption, to be less than or equal to 20° C. or equal to an ambient temperature. In other features, the controller is configured to control the heat source to generate a plurality of thermal energy pulses to heat the modified material of the substrate without heating at least one of a base or a bulk portion of the substrate.

In other features, the controller is configured to supply the first process gas to the processing chamber to perform the atomistic adsorption on the exposed material of the substrate between each consecutive pair of thermal energy pulses of the heat source. In other features, the controller is configured to modify, during the pretreatment, the substrate by subjecting the substrate to a second process gas. In other features, the controller is configured to pulse the heat source to generate a plurality of thermal energy pulses within one second.

In other features, the pretreatment includes introduction of a second process gas. The second process gas includes hydrogen. The halogen species includes oxygen. The pulsed thermal annealing includes removal of a monolayer from the substrate. The monolayer includes germanium.

In other features, the pretreatment includes introduction of a second process gas. The second process gas includes hydrogen. The halogen species includes chlorine. The pulsed thermal annealing includes removal of a monolayer from the substrate. The monolayer includes germanium.

In other features, the pretreatment includes introduction of a second process gas. The second process gas includes hydrogen. The halogen species includes iodine. The pulsed thermal annealing includes removal of a monolayer from the substrate. The monolayer includes silicon. In other features, the pulsed thermal annealing includes selectively removing silicon without removing germanium.

In other features, the pretreatment includes introduction of a second process gas, wherein the second process gas includes hydrogen or oxygen. The halogen species includes chlorine. The pulsed thermal annealing includes removal of a monolayer from the substrate. The monolayer includes titanium.

In other features, the pretreatment includes introduction of a second process gas. The second process gas includes hydrogen or ammonia. The halogen species includes fluorine. The pulsed thermal annealing includes removal of a monolayer from the substrate. The monolayer includes silicon dioxide.

In other features, a method of operating a substrate processing system is provided. The method includes disposing a substrate on a substrate support in a processing chamber and iteratively performing a first atomic layer etch (ALE) process. The first ALE process is a sequential isotropic process and includes performing: pretreatment including supplying a first process gas to the processing chamber to modify a first exposed portion of the substrate; atomistic adsorption including subjecting the first exposed portion to a second process gas including a halogen species to selectively absorb onto and modify the first exposed portion; and pulsed thermal annealing including controlling a heat source to generate a thermal energy pulse to expose and remove the modified first exposed portion. The method further includes:

determining whether a predetermined number of cycles of the first ALE process has been performed; and if the predetermined number of cycles has been performed, ceasing to perform the first ALE process.

In other features, the method further includes purging the processing chamber subsequent to performing the atomistic adsorption and prior to performing the pulsed thermal annealing. In other features, the method further includes purging the processing chamber subsequent to performing each iteration of the pulsed rapid thermal annealing. In other features, the method further includes performing the first ALE process a plurality of times within one second.

In other features, the method further includes: determining whether to perform a second ALE process; changing parameters set for the first ALE process to updated parameters for the second ALE process; and iteratively performing within the processing chamber the second ALE process. The second ALE process includes: performing pretreatment including supplying the first process gas or a third process gas to the processing chamber to modify the first exposed portion or a second exposed portion of the substrate; performing atomistic adsorption including subjecting the first exposed portion or the second exposed portion to the second gas or a fourth gas including a halogen species; and performing pulsed rapid thermal annealing including controlling the heat source to generate a thermal energy pulse to heat the first exposed portion or the second exposed portion.

In other features, the method further includes: determining whether to perform a second ALE process, wherein the first ALE process is performed on a first die of the substrate; and performing the second ALE process on a second die of the substrate. In other features, the method further includes, for the rapid thermal annealing: charging capacitors; and discharging the capacitors to provide power to a plurality of flash lamps.

In other features, the method further comprising, for the rapid thermal annealing: generating a laser beam; converting the laser beam to a flat-top beam; converting the flat-top beam to a square beam; reflecting the square beam off of mirrors and to a tele-centric lens assembly; and passing the square beam through the tele-centric lens assembly to the substrate in a direction orthogonal to the substrate.

In other features, the method further includes, for the rapid thermal annealing, adjusting the size of the square beam to be greater than or equal to a size of a die of the substrate. In other features, the method further includes, for the rapid thermal annealing: steering the laser beam by moving mirrors to span across the substrate, wherein a diameter of the substrate is 300 mm, and wherein the substrate includes dies; and within a predetermined period, span across and heat each of the dies.

In other features, the predetermined period is one second; and each of the dies is heated individually and a predetermined number of times. In other features, the first gas includes hydrogen. The halogen species includes oxygen. The pulsed thermal annealing includes removal of a monolayer from the substrate. The monolayer includes germanium.

In other features, the first gas includes hydrogen. The halogen species includes chlorine. The pulsed thermal annealing includes removal of a monolayer from the substrate. The monolayer includes germanium.

In other features, the first gas includes hydrogen. The halogen species includes iodine. The pulsed thermal annealing includes removal of a monolayer from the substrate. The monolayer includes silicon. In other features, the pulsed thermal annealing includes selective removal of silicon and not removal of germanium.

In other features, the first gas includes hydrogen or oxygen. The halogen species includes chlorine. The pulsed thermal annealing includes removal of a monolayer from the substrate. The monolayer includes titanium.

In other features, the first gas includes hydrogen or ammonia. The halogen species includes fluorine. The pulsed thermal annealing includes removal of a monolayer from the substrate. The monolayer includes silicon dioxide.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 4 is a temperature profile over time illustrating an example heating ramp up and cool down period associated with a traditional continuous wave mode of operation;

FIG. 5 is an example temperature profile over time illustrating example rapid thermal pulses in accordance with the present disclosure;

FIG. 24 is an example graph of etch depth ranges and surface roughness associated with measurements of samples taken prior to heating, subsequent to flash lamp heating for different energy levels, and subsequent to substrate support heating;

FIG. 37 is an example plot of etch depth and surface roughness for a heated substrate support implementation and a laser implementation.

In the drawings, reference numbers may be reused to identify similar and/or identical elements.

DETAILED DESCRIPTION

Figure 1:
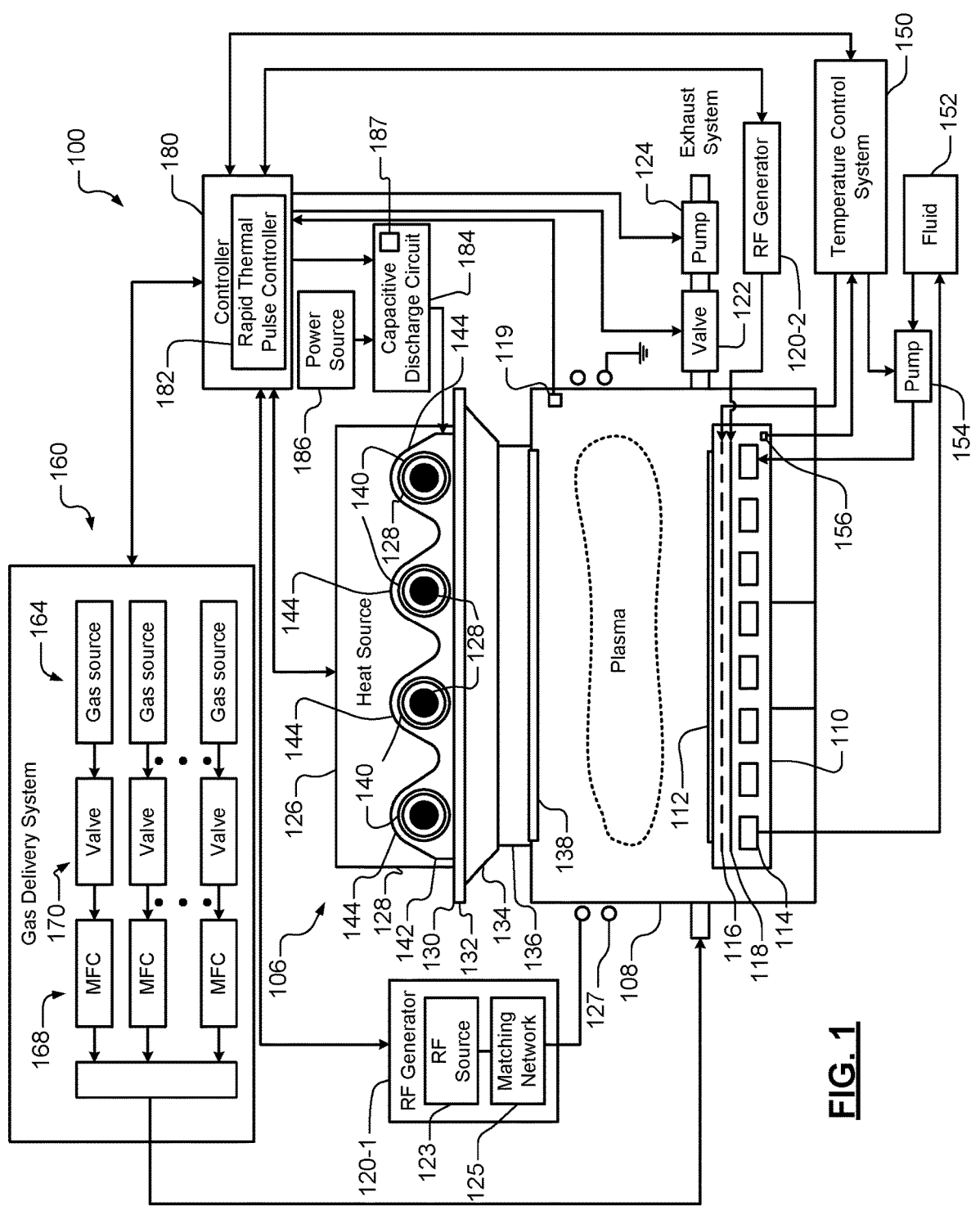
FIG. 1 a functional block diagram of an example of a substrate processing system incorporating a flash lamp and a rapid thermal pulse controller for performing rapid thermal pulse operations during ALE and atomic layer deposition (ALD) in accordance with the present disclosure.

To fabricate sub-7 nanometer (nm) devices, isotropic removal of material from a substrate with nano-scale control is needed. At the nano-scale level, traditional dry etching and wet etching can cause substrate surface roughness and/or damage. In addition, ALE is limited in isotropic removal due to ion directionality. In order to remove, for example, an upper portion of a substrate, the upper portion may be modified to provide an upper volatile layer. The upper volatile layer may then be removed by heating the upper volatile layer via a lamp. A traditional lamp (e.g., infrared lamp) may heat a portion of a substrate, for example, at 40-250° C./second. Time for the lamp to heat the upper volatile layer and for the upper volatile layer to cool down can take several minutes. The amount of time needed to heat up and cool down the substrate can be based on the heating and cooling rates of a substrate support, such as an electrostatic chuck. Time for the substrate and the substrate support to heat up and cool down can take tens of minutes.

Due to the lengthy period to heat the substrate, the entire substrate including a base or bulk portion of the substrate is typically heated. As a result, traditional heating by turning on a heating lamp for an extended period of time has thermal budget issues due to the heating of a bulk portion of a substrate and not heating only an upper portion and/or surface of the substrate. This type of heating has limited use to certain etching processes. The thermal budget refers to an amount of time a substrate is able to be exposed to particular temperatures without: degrading materials and/or make-up of the substrate; negatively affecting performance and/or operation of die components on the substrate; and/or causing inter-diffusion issues, where molecules and/or atoms of one species layer are diffused into another species layer. The higher the temperature and the longer the exposure, the more likely and the more prevalent the thermal budget issues. As an example, using a traditional heating lamp, a thermal cycle providing temperature increases greater than 200° C. can result in Si diffusion into Ge, while a thermal cycle having a temperature increase of 40° C. may not result in Si diffusion into Ge. The thermal budget issues limit processes that are able to be performed on a substrate, especially within a single processing chamber. In order to avoid waiting for a substrate support to cool down and to quickly perform different processes, a substrate may need to be moved between processing chambers.

The examples set forth herein include rapid thermal pulsing (RTP) systems for performing RTP cycles via heat sources to rapidly increase temperatures of upper portions of substrates. By rapidly heating the upper portions and not heating bases or bulk portions of the substrates, the upper portions of the substrates are able to rapid decrease in temperature after the heat sources are deactivated. Multiple heating and cooling cycles may be performed as described below in a few seconds. The RTP is provided and prevents thermal budget issues. In other words, thermal heating is provided without heating and/or minimizing the amount of heating of a lower bulk portion of a substrate. This allows for rapid heating and cooling of a surface and/or upper portions of a substrate to rapidly perform multiple cycles of a process, and/or multiple different processes within a single processing chamber. As an example, the upper portions may be a few hundred nanometers thick (or depth of heating is a few hundred nanometers into the substrate) and measured from a heated surface of the substrate.

The RTP operations also enable performance of processes that were previously not performed due to sensitivity to thermal budget issues. As an example, isotropic and selective removal of certain film materials from substrates may be performed. The film materials that may be removed include silicon, germanium, metal oxides such as aluminum oxide, titanium oxide, and zirconium oxide, and other materials such as titanium nitride, etc.

Referring now to FIG. 1, an example of a substrate processing system 100 that can be used is shown. While the substrate processing system 100 includes an inductively coupled plasma (ICP) source, other types of processing chambers and/or plasma sources (such as remote plasma sources) may be used. A remote plasma source may optionally be provided to utilize radicals. An example of another processing chamber is a remote plasma source connected chamber (or first chamber) that is connected to another processing chamber (or second chamber). The substrate processing system 100 includes an RTP system 106 and a processing chamber 108. The processing chamber 108 includes a substrate support 110 for supporting a substrate 112. The RTP system 106 rapidly and iteratively heats a surface and/or a portion of the substrate 112. In some examples, the substrate support 110 includes an electrostatic chuck or vacuum chuck. In some examples, the substrate support 110 is temperature controlled. For example, the substrate support 110 may include fluid channels 114 and/or heaters 116, which may be arranged in one or more zones. The substrate support 110 may further include an electrode 118.

One or more sensors 119 such as temperature and/or pressure sensors may be arranged in the processing chamber 108 to sense temperature and/or pressure, respectively. A valve 122 and pump 124 may be used to control pressure within the processing chamber 108 and/or to evacuate reactants from the processing chamber 108.

Figure 2:
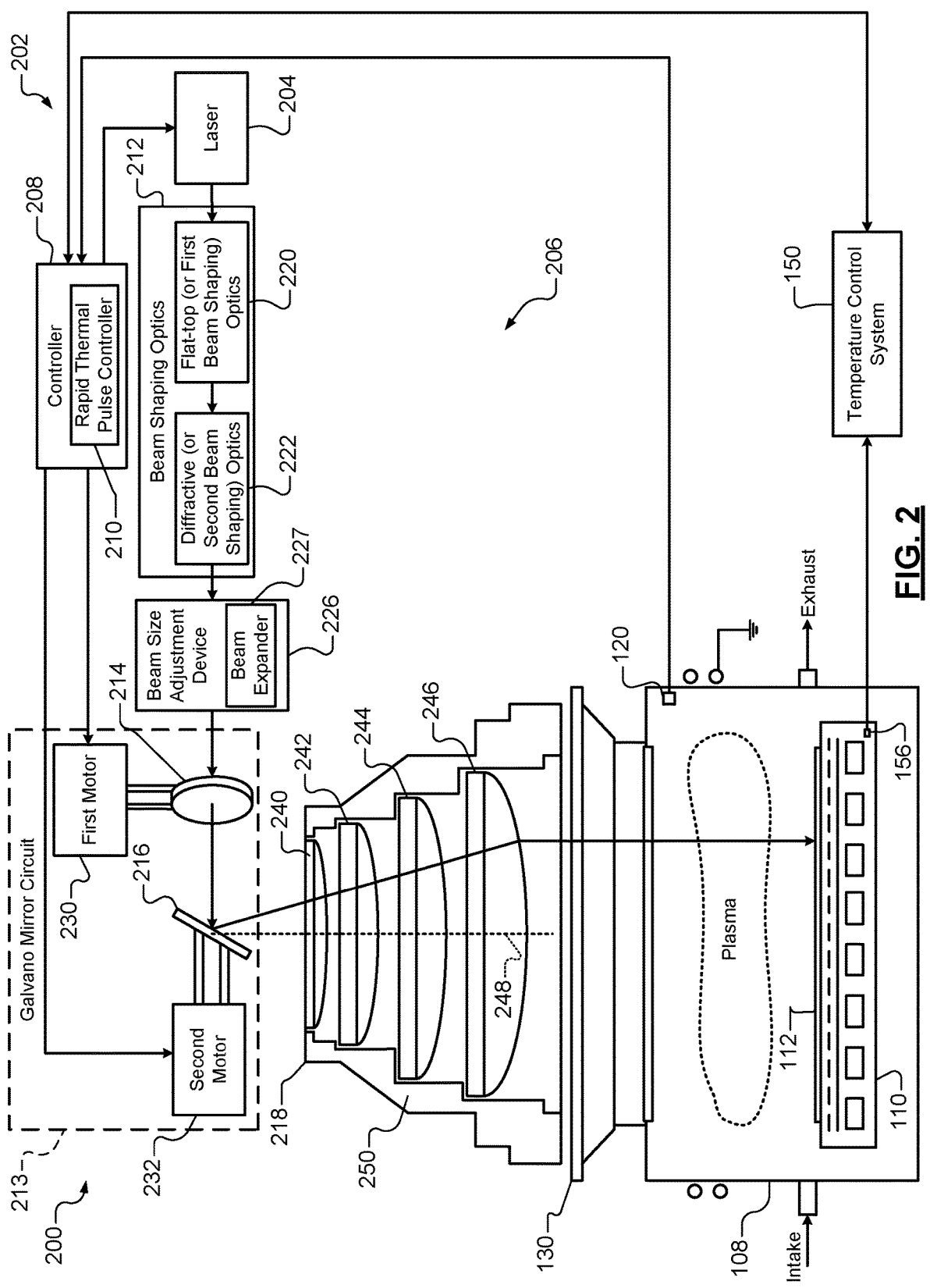
FIG. 2 a functional block diagram of an example of a substrate processing system incorporating a laser, a lens circuit and a rapid thermal pulse controller for performing rapid thermal pulse operations during ALE and ALD in accordance with the present disclosure.

The RTP system 106 includes a heat source 126 that performs rapid thermal annealing of the substrate 112. This includes RTP via flash lamps 128. An example of another RTP system that is laser based is shown in FIG. 2. A window assembly 130 may be disposed between the heat source 126 and the processing chamber 108. The window assembly 130 includes a first (or dielectric) window 132, a reflector 134, a coupling member 136 and a second window 138. The first window 132 may be a quartz window. The reflector 134 may be formed of stainless steel and may be conical-shaped to direct thermal energy generated by the flash lamps 128 towards the substrate 112. The second window 138 may be a sapphire window. The coupling member 136 connects the reflector 134 to the processing chamber 108. In one embodiment, the reflector 134 is not included and the first window 132 is attached to the coupling member 136. The flash lamps 128 may be cylindrically-shaped and include respective cooling jackets 140 through which water and/or other cooling fluid may be circulated to cool the flash lamps 128. A reflector 142 having parabolic reflective portions 144 may be disposed on the first window 132. The reflector 142 may be formed of aluminum. The flash lamps 128 are disposed respectively in the parabolic reflective portions 144 between the reflector 142 and the first window 132.

A temperature control system 150 may be used to control a temperature of the substrate support 110 and the substrate 112. The temperature control system 150 may control supply of a fluid from a fluid source 152 via a pump 154 that is connected to the fluid channels 114. The temperature control system 150 may also control operation of the heaters 116. The temperature control system 150 may include one or more temperature sensors 156 to sense temperatures of one or more locations or zones of the substrate support 110.

A gas delivery system 160 includes one or more gas sources 164, one or more valves 106, one or more mass flow controllers 168 and a mixing manifold 170. The gas delivery system 160 selectively supplies a plasma gas mixture, carrier and/or inert gases, and/or a purge gas mixture to the processing chamber 108 during pretreatment, doping, passivation, annealing and/or purging.

An RF generator 120-1 includes an RF source 123 and a matching network 125 that outputs RF power to a coil 127, which surrounds an outer wall of the processing chamber 108. The RF generator 120-1 creates a magnetic field in the processing chamber 108 that strikes plasma. Another RF generator 120-2 may be used to supply an RF bias to the electrode 118 in the substrate support 110. A controller 180 communicates with the one or more sensors 119, the valve 122 and pump 124, the temperature control system 150, the heat source 126, the RF generators 120-1 and/or 120-2, and the gas delivery system 160 to control the process being performed.

The controller 180 may include a RTP controller 182, which controls a capacitive discharge circuit 184 to pulse the flash lamps 128. The capacitive discharge circuit 184 may receive power from a power source 186 and a control signal from the RTP controller 182. The capacitive discharge circuit 184 may charge capacitors (represented by box 187) when in an idle mode and may discharge the capacitors upon receiving a discharge signal from the RTP controller 182. The RTP controller 182 may perform RTP operations during ALE and/or ALD processes.

FIG. 2 shows an example of a substrate processing system 200 incorporating a RTP system 202 including a laser 204, a lens circuit 206 and a controller 208 with a RTP controller 210. The substrate processing system 200 may operate similar to the substrate processing system 100 of FIG. 1 and include portions of the substrate processing system 100 not shown in FIG. 2. The substrate processing system 200 includes the laser 204, the lens circuit 206, and the controller 208 instead of the heat source 126, the controller 180, and the capacitive discharge circuit 184. The laser 204 is a heat source that may be pulsed (or modulated) by the RTP controller 210 during RTP operations based on a control signal received from the RTP controller 210. This may occur during ALE and ALD processes.

The lens circuit 206 includes beam shaping optics 212, a Galvano mirror circuit 213 that includes a first mirror 214 and a second mirror 216, and a tele-centric lens assembly 218. The beam shaping optics 212 may include flat-top (or first beam shaping) optics 220 and diffractive (or second beam shaping) optics 222. The flat-top optics 220 are used to convert a laser beam received from the laser 204, where the laser beam has a Gaussian distribution, into a flat-top beam (e.g., a 2 centimeter (cm)×2 cm flat-top beam). A temperature profile of the laser beam is also Gaussian. An example of a flat-top optic is a "flywheel" optic.

The diffractive optics 222 convert the flat-top circular beam out of the flat-top optics 220 to a square beam. The square beam has a corresponding uniform temperature distribution on a substrate. This allows for a uniform thermal reaction and/or etch rate over the portion of a substrate (e.g., substrate 112) exposed to the square beam. Providing a square beam also provides a beam with a shape that matches a shape of a die being heated. The square beam may uniformly heat a surface or an upper portion of a selected die. The substrate 112 may be disposed on the substrate support in the processing chamber 108.

A beam size adjustment device 226 may be disposed between the beam shaping optics 212 and the first mirror 214. The beam size adjustment device 226 may adjust a size of the square beam to be greater than or equal to a size of a die on the substrate 112. The beam size adjustment device 226 may be motorized and include a beam expander 227. The beam expander 227 may perform magnification and increase a size of the laser beam.

The RTP controller 210 and the Galvano mirror circuit 213 may operate as a X-Y galvanometer scanning system. The first mirror 214 may be used to move the laser beam across a surface of the substrate 112 in a first (or X) direction. The second mirror 216 may be used to move the laser beam across the surface of the substrate in a second (or Y) direction. The controller 208 and/or the RTP controller 210 may move the mirrors 214, 216 via motors 230, 232.

The tele-centric lens assembly 218 may be referred to as a collimating assembly and includes a series of plano-convex lenses 240, 242, 244, 246. Although a particular number of plano-convex lenses are shown, a different number of plano-convex lenses may be included. The diameter of the plano-convex lenses 240, 242, 244, 246 increases the closer the plano-convex lens is to the window assembly 130, such that: a diameter of the lens 242 is larger than a diameter of the lens 240; a diameter of the lens 244 is larger than the diameter of the lens 242; and a diameter of the lens 246 is larger than the diameter of the lens 244. The plano-convex lenses 240, 242, 244, 246 are vertically aligned to have a common centerline 248. The plano-convex lenses 240, 242, 244, 246 are held in a fixed relationship within a mold 250. The plano-convex lenses 240, 242, 244, 246 direct the laser beam received from the second mirror 216 to be orthogonal to the surface of the substrate 112. As the laser beam is moved across the surface of the substrate 112, the tele-centric lens assembly 218 maintains the laser beam in an orthogonal relationship with the surface of the substrate 112.

As an example, the laser beam generated by the laser 204 may be 355 nm in diameter and may be pulsed every 80 picoseconds (ps). The RTP controller 210 may move the mirrors 214, 216 to perform 150 Hertz (Hz) scan across the surface of the substrate 112.

The substrate processing system 200 may include the temperature control system 150, which may be used to control a temperature of the substrate support 110 and the substrate 112. The temperature control system 150 may include the one or more temperature sensors 156 to sense temperatures of one or more locations or zones of the substrate support 110.

Figure 3:
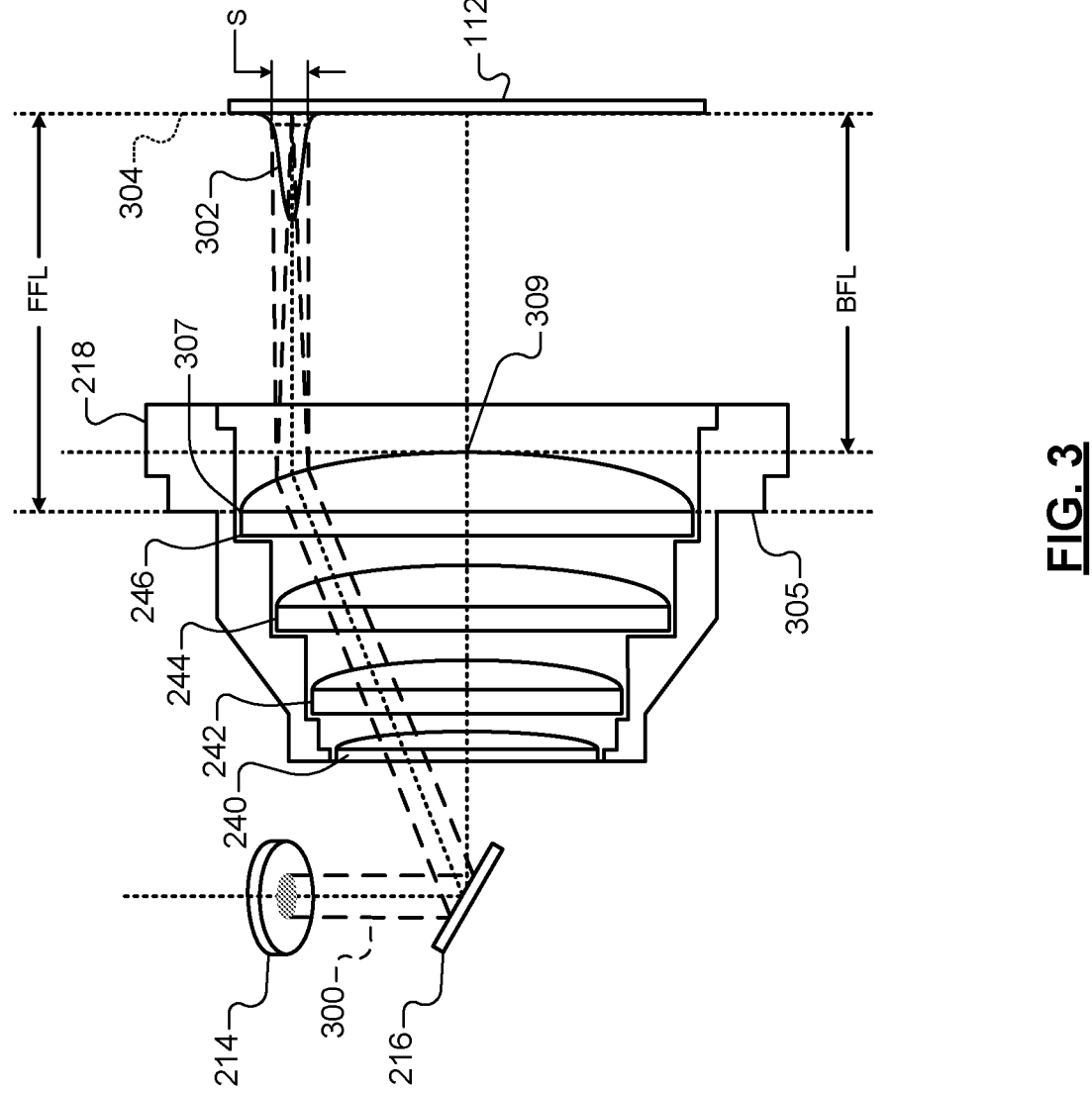
FIG. 3 is a side cross-sectional view of mirrors and a tele-centric lens assembly incorporated in the lens circuit of FIG. 2.

FIG. 3 shows a side cross-sectional view of the mirrors 214, 216 and the tele-centric lens assembly 218 of FIG. 2. The mirrors 214, 216 are shown and direct a laser beam 300 through the tele-centric lens assembly 218. The laser beam 300 is passed through the lenses 240, 242, 244, 246 from the smallest lens 240 to the largest lens 246. When the laser beam 300 is round and does not pass through the beam shaping optics 212 of FIG. 2, the laser beam has a Gaussian distribution as represented by curve 302 on an image plane 304 or surface of the substrate 112. When the laser beam 300 passes through the beam shaping optics 212, the laser beam is square shaped and has a spot with sides S.

The Galvano mirror circuit 213 of FIG. 2 provides a system including 2 mirrors for scanning a full field-of-view (FOV). As an example, the FOV may be greater than 300 mm×300 mm. In one embodiment, the lenses 240, 242, 244, 246 collectively have a low numerical aperture (less than a predetermined numerical aperture) and a focal column parameter (or beam perpendicularity parameter) within a predetermined range of being perpendicular relative to the image plane 304. The laser beam is provided perpendicular to the image plane without beam distortion at the image plane while beam uniformity and intensity is maintained. The laser beam may be focused on the image plane 304. In one embodiment, the pupil aperture or size of a side S of the beam spot is limited to 10-12 mm. The beam size adjustment device 226 of FIG. 2 may increase the size of the beam spot, such that S is 20-22 mm.

A flange focal length (FFL) and a back focal length (BFL) are shown. The FFL may be a distance from (i) an end of a flange 305 and/or a point 307 where the lens 246 begins to curve and protrude outward towards the image plane 304, and (ii) the image plane 304. The BFL may refer to a distance from (i) a point 309 on the lens 246 closest to the image plane 304, and (ii) the image plane 304.

The above-described examples of FIGS. 1-3 provide a flash lamp example and a laser beam example. The flash lamps may be modulated (or pulsed) every predetermined number of micro-seconds (e.g., every 300 µs) and the laser beam may be modulated (or pulsed) every predetermined number of pico-seconds (e.g., every 80 ps). The examples allow for performing a sequential thermal ALE or ALD process. As an example, a 100 µs pulsed light source may be used providing 8 Joules (J) of lamp power per centimeter squared (cm$^2$) with a 1 Hz cycle. Greater than 50 cycles may be performed for a single recipe within a single processing chamber. An ALE process may be performed including atomistic and isotropic removal of material. These processes are efficiently performed while controlling substrate temperatures without thermal budget issues.

FIG. 4 shows a temperature profile over time illustrating an example heating ramp up and cool down period associated with a traditional continuous wave mode of operation. As shown, a traditional heating lamp operating in the continuous wave mode may heat a substrate from 20° C. to 100-600° C. in x seconds. The heating lamp may be ON for t minutes. The substrate may cool down in y seconds.

FIG. 5 shows an example temperature profile over time illustrating example rapid thermal pulses. In FIG. 5, low temperature pulses and high temperature pulses are shown for example purposes. As an example, the low temperature pulses may be provided to increase temperatures of a portion of a substrate to 80° C. per cycle. The high temperature pulses may increase temperatures of the portion of the substrate to 600° C. per cycle. In one embodiment, the low temperature pulses increase temperatures of the portion of the substrate to 20-80° C. In one embodiment, the high temperature pulses increase temperatures of the portion of the substrate to 100-600° C. In another embodiment, the low temperature pulses are not provided. The portion of the substrate being heated is cooled down for example to a baseline temperature (e.g., 20° C.) between each consecutive pair of the low temperature pulses and/or the high temperature pulses. Multiple low temperature and/or high temperature pulses may be provided and the portion of the substrate being heated may cool down between sequential ones of the pulses over a predetermined number of seconds (shown as x seconds). As an example, multiple low temperature pulses and high temperature pulses may be provided over a 3-10 second long period.

The RTP described herein allows for heating and controlling substrate surface temperatures. Heating is provided to predetermined depths of a substrate in a controlled and tunable manner while providing atomistic reaction control. This may be accomplished by controlling the number, length, intensity, and frequency of the light (e.g., flash lamp or laser) pulses being generated. In one embodiment, a series of high temperature pulses are provided. In other embodiment, a series of low temperature pulses are provided. In another embodiment, a combination of low temperature and high temperature pulses are provided and the durations, intensities (or power levels) and frequencies of the pulses are controlled to provide a temperature depth profile across at least a portion of a surface of a substrate. By having multiple flash lamps as in the embodiment of FIG. 1, different temperature zones may be created by operating the flash lamps differently. For example, a first one or more of the flash lamps may be operated to provide a first series of pulses having a first set of one or more durations, one or more intensity levels (or power levels) and one or more frequencies and a second one or more of the flash lamps may be operated to provide a second series of pulses having a second set of one or more durations, one or more intensity levels (or power levels) and one or more frequencies.

Figure 6:
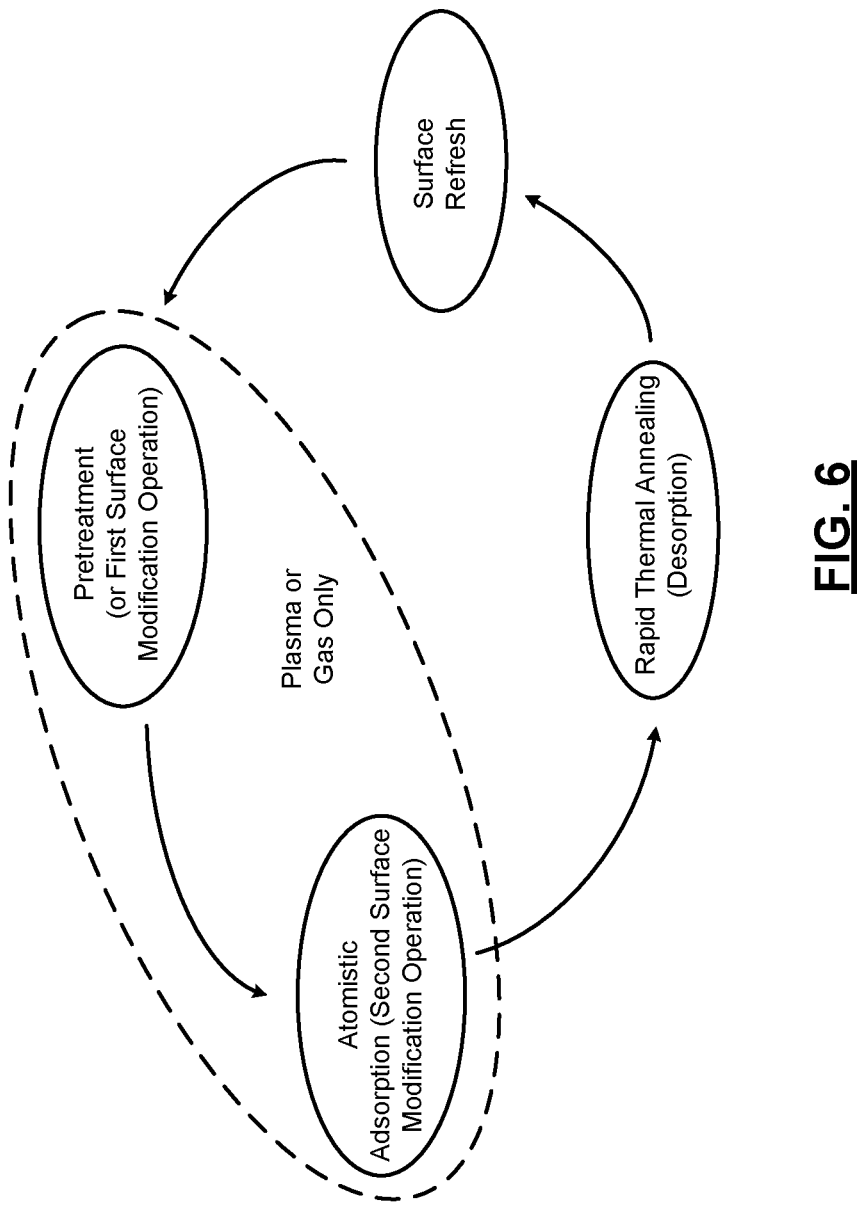
FIG. 6 is a ALE process diagram in accordance with the present disclosure.

FIG. 6 shows an ALE process diagram illustrating a thermal ALE process performed in accordance with the present disclosure. The thermal ALE process may include iteratively performing pretreatment, atomistic adsorption (or condensation), RTP (or thermal removal), and surface refresh (or purge) operations. RTP may be used to remove films atomistically and isotropically without thermal budget issues, as compared to traditional continuous wave (CVV) heating approaches. In one embodiment, thermal pulse durations are less than 3 ms in duration and increase surface substrate temperatures to approximately 500° C. to avoid thermal budget issues. For example, this type of RTP may be performed when etching silicon (Si) to prevent Si diffusion in germanium (Ge).

During pretreatment (or a first surface modification operation), hydrogen $H_2$, ammonia $NH_3$, and/or other gas may be supplied to while providing a plasma to modify the surface and/or portion of a substrate. During atomistic adsorption (or a second surface modification operation), oxygen, a halogen gas (e.g., chlorine $Cl_2$, iodine $I_2$, fluorine $F_3$, or other halogen gas), nitrogen trifluoride $NF_3$, and/or other reactant is provided and adsorbed into the surface and/or portion of the substrate. The portion of the substrate subject to atomistic adsorption may be formed of, for example, a metal oxide $MO_x$ such as aluminum (Al) oxide $Al_2O_3$, titanium (Ti) oxide $TiO_2$, or zirconium (Zr) oxide or other material such as silicon nitride $SiN_x$, Si, Ge, $SiO_2$, titanium nitride TiN, or hafnium oxide $HfO_2$. Subsequent to atomistic adsorption, the portion being removed may be, for example: an oxide or halide with or without a ligand; $MCl_x(F_x)$; aluminum fluoride $AlF_3$; titanium oxide $TiO_2$; ammonium fluorosilicate $(NH_4)_2SiF_6$; or other modified material.

In an embodiment, a predetermined number of cycles are performed to remove a predetermined amount of one or more layers of a substrate. As an example, a 1 nm thick layer of an uppermost portion of a substrate may be removed per cycle of the thermal ALE process. During the rapid thermal operation, a flash lamp assembly or a laser may be used as shown in FIGS. 1-2. Table 1 provides five examples (one per row) of the thermal ALE process being performed on different types of substrates. The columns indicate: a) substrate materials being removed; b) types of plasma being provided during pretreatment (PT); c) gases being supplied during the atomistic adsorption (AA) operation; d) flash lamp or laser may be performed for the rapid thermal (RT) heating operation; and a purge gas being provided during the surface refresh (SR) operation.

TABLE 1

| Process | PT | AA | RT | SR |
|---|---|---|---|---|
| Ge Removal | $H_2$ Plasma | $O_2$ | Flash Lamp or Laser | Ar |
| Ge over Si Removal | $H_2$ Plasma | $Cl_2$ | Flash Lamp or Laser | Ar |
| Si over Ge Removal | $H_2$ Plasma | $I_2$ | Flash Lamp or Laser | Ar |
| TiN Removal | $H_2$ Plasma | $Cl_2$ | Flash Lamp or Laser | Ar |
| $SiO_2$ Removal | $NH_3$, $H_2$ Plasma | $NF_3$, $F_3$ | Flash Lamp or Laser | Ar |

The thermal ALE processes disclosed herein may be performed on other types of substrates. The thermal ALE processes may be performed to remove target films including, for example, germanium Ge, a metal nitride (e.g., TiN), a compound including Si—SiGe, and/or a metal oxide (e.g., $Al_2O_3$ or $HfO_2$). The corresponding by-products that may be removed include germanium oxide GeO, titanium oxychloride TiOCl, titanium oxyfluoride TiOF, silicon chlorine Si—Cl, silicon fluorine Si—F, germanium chlorine Ge—Cl, germanium fluorine Ge—F, aluminum acetylacetonate Al(acac)$_4$, and hafnium acetylacetonate Hf(acac)$_4$.

The substrates may cool down during the surface refresh operations. In one embodiment, active cooling is provided to cryogenically cool the substrates. This shortens the amount of time to cool down the substrates and allows for more cycles to be performed in shortened period of time. Active cooling provides quick recovery without negatively affecting the base (or bulk) portion of the substrates.

Figure 7:
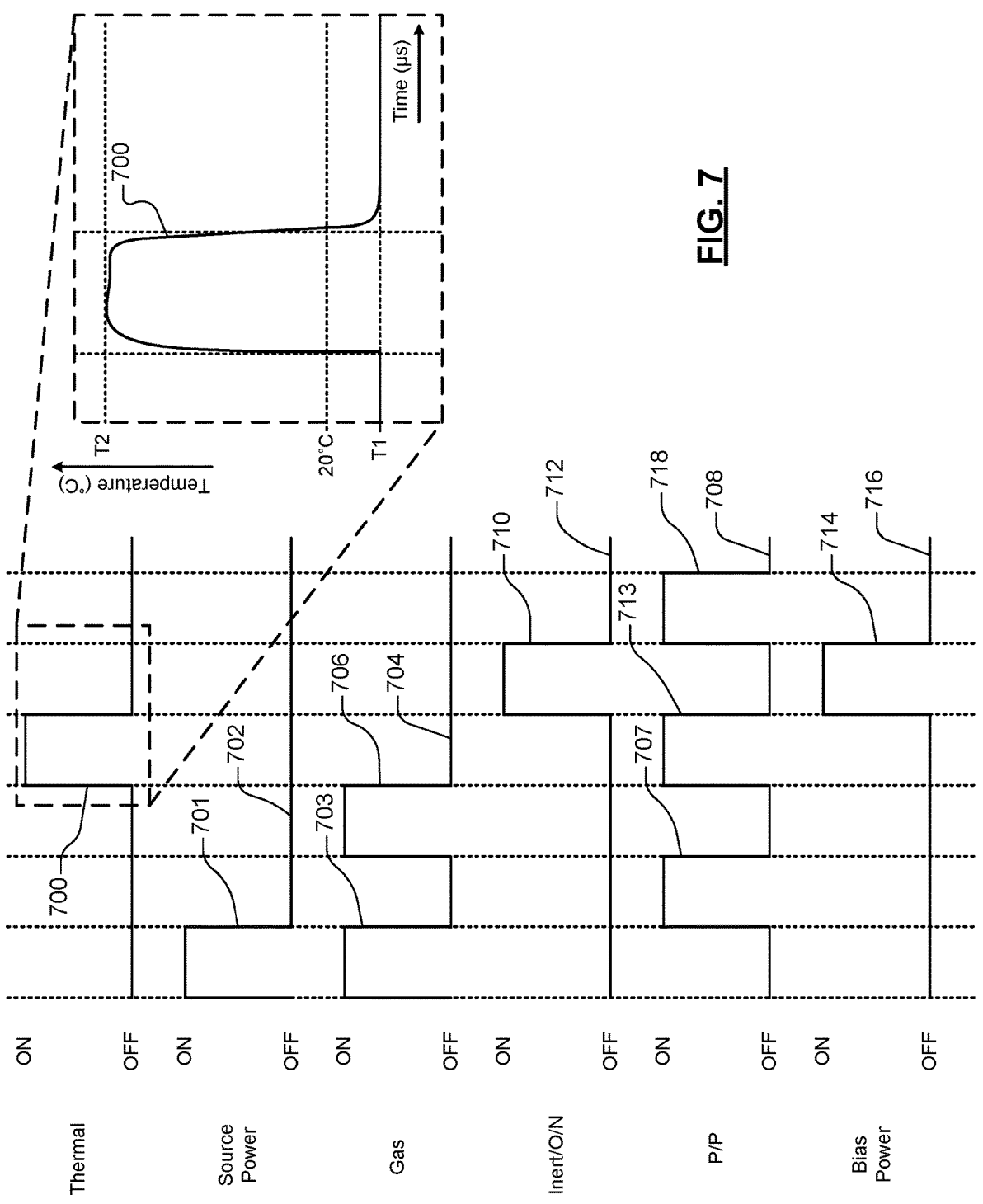
FIG. 7 is an example signal diagram illustrating temperature change over time for a single rapid thermal pulse provided in accordance with the present disclosure.

FIG. 7 shows an example signal diagram illustrating a temperature change pattern over time for a provided single rapid thermal pulse 700. A pulsed thermal source may be used to control surface reactions of a substrate over a predetermined number of milliseconds during ALE or ALD processes. In one implementation, plasma may be generated by turning on source power (represented by pulse 701 of curve 702) and supplying gas (represented by pulse 703 of curve 704) to a processing chamber. The circuits of the substrate may be cleaned by turning on a pump (e.g., the pump 124 of FIG. 1) and performing a purge operation (represented by pulse 707 of curve 708). Surface modification and atomistic adsorption (or condensation) operations may then be performed represented by pulse 706 followed by the thermal heating represented by pulse 700. The processing chamber may then be purged as represented by pulse 710 of curve 712 and pulse 713 of curve 708. Optionally, bias power may be provided as represented by pulse 714 of curve 716. The pump may then be activated to perform a purge as represented by pulse 718.

Figure 8:
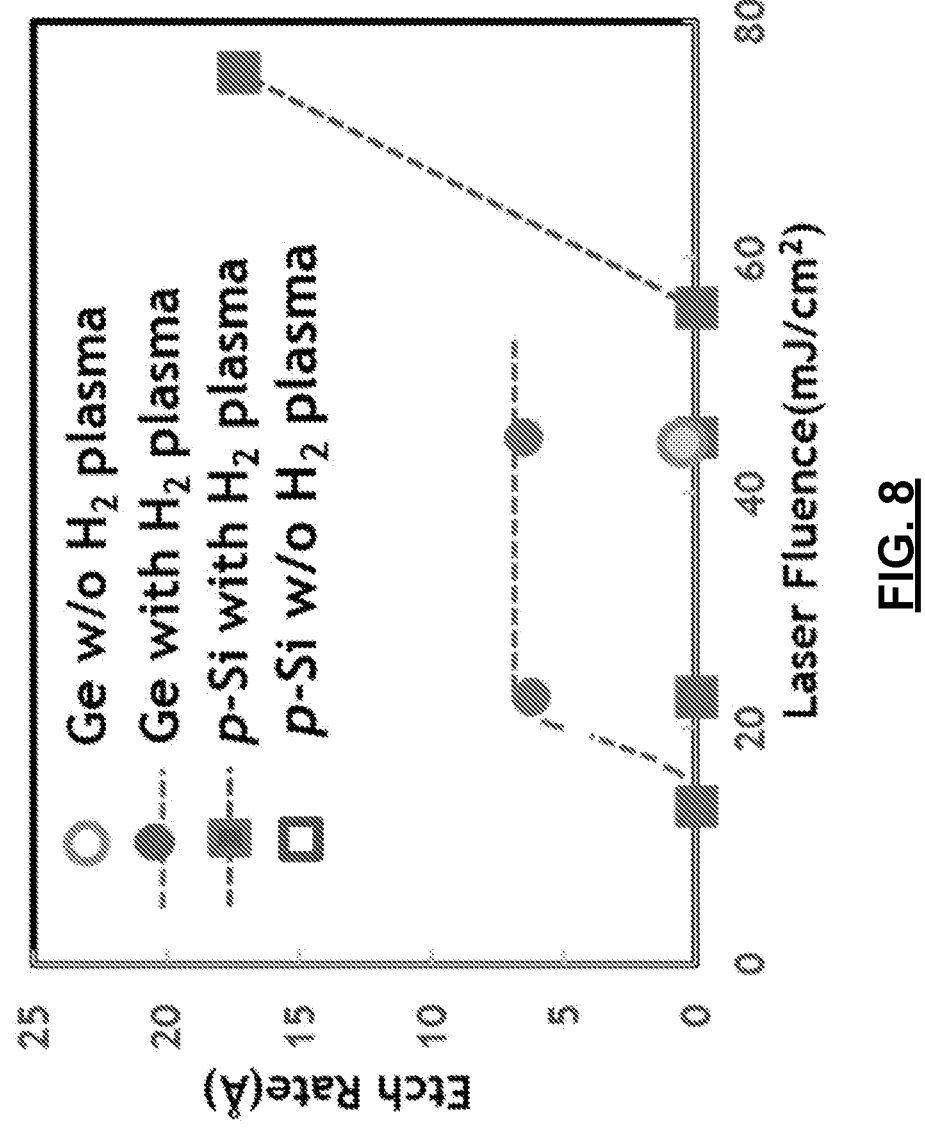
FIG. 8 is an example etch rate versus laser fluence plot for ALE performed in accordance with the present disclosure.

FIG. 8 shows an example etch rate versus laser fluence plot for ALE performed, illustrating differences for Ge without H$_2$ plasma surface modification, Ge with H$_2$ plasma surface modification, p-type Si with H$_2$ plasma surface modification, and p-type Si without H$_2$ plasma surface modification.

Selective removal of portions of Si or Ge layers of a substrate having both Si and Ge layers can be challenging for nano-wire fabrication processes due to similarities of byproducts formed from etching of Si and Ge layers during plasma processing. An example implementation disclosed herein allows for selective removal of Si or Ge layers of a substrate having both Si and Ge layers. The example implementation includes RTP to heat a surface temperature of a substrate during a certain process window of time. H$_2$ plasma treatment for surface modification is performed and reaction time is controlled to selectively etch a Si layer or a Ge layer. This process prevents thermal budget issues unlike a conventionally heated substrate support, which can experience the thermal budget issue of inter-diffusion.

Figure 9:
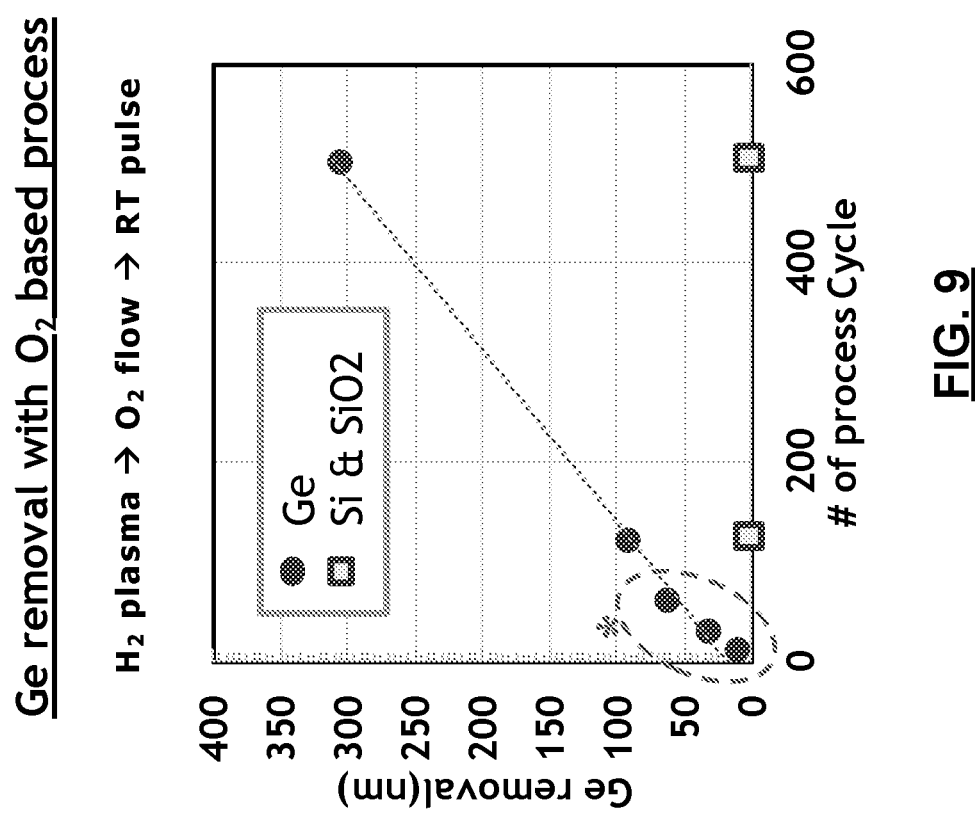
FIG. 9 is an example plot of amounts of germanium removed versus numbers of process cycles for ALE performed in accordance with the present disclosure.
Figure 10:
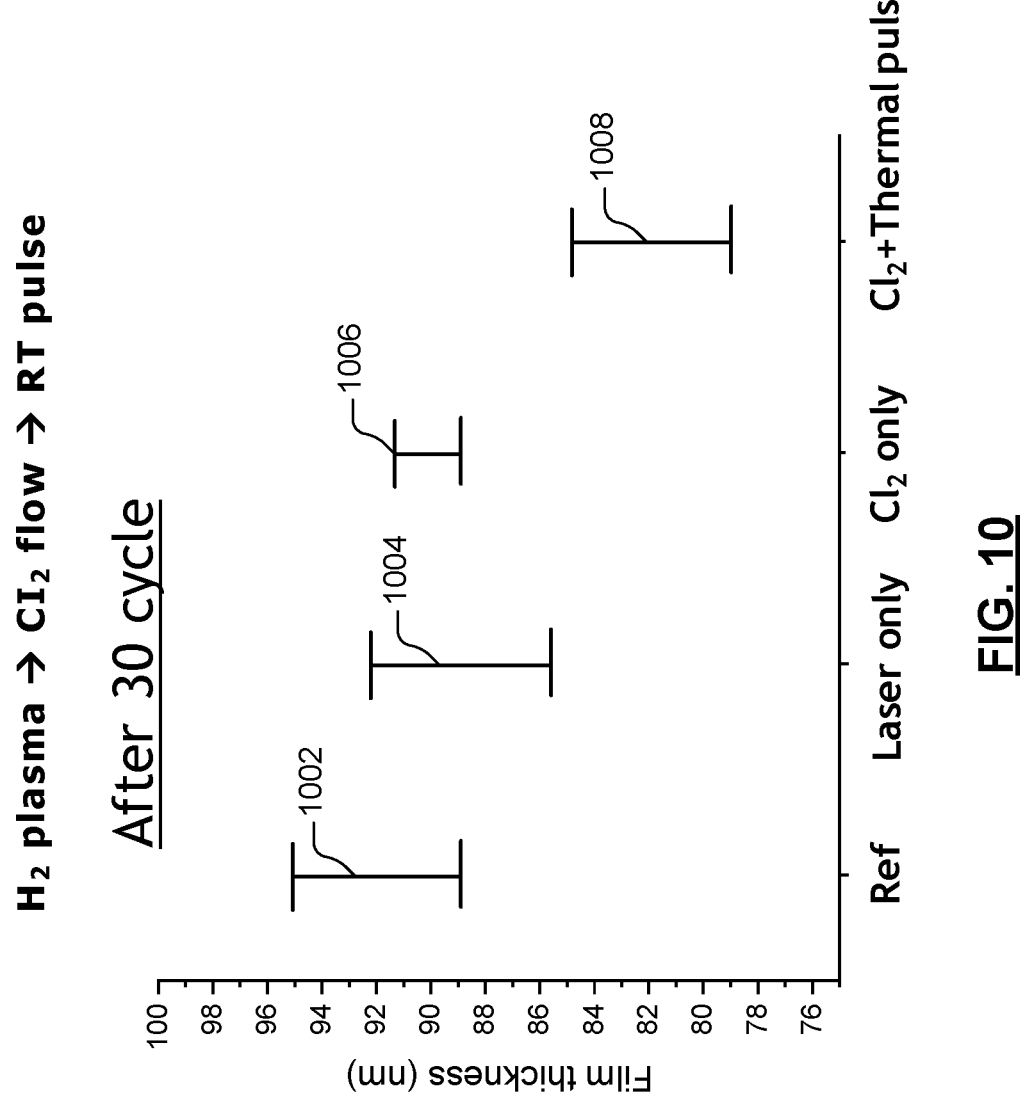
FIG. 10 is an example plot of film thicknesses illustrating different amounts of material removal for reference, pulsed laser heating without chlorine adsorption, chlorine adsorption without pulsed laser heating, and a combination of chlorine adsorption and pulsed laser heating implementations.

The following FIGS. 9-10 illustrate differences between using O$_2$ and Cl$_2$ for atomistic adsorption during a thermal ALE of Ge and TiN. Ge and TiN removal rates are increased linearly as the number of process cycles are increased. Selectivity is controlled by chemistry of pretreatment and thermal energy provided. FIG. 9 shows a plot of an amount of Ge removed versus number of process cycles for ALE performed. The Ge is removed at ambient (or room) temperature. FIG. 10 shows film thicknesses illustrating different amounts of TiN material removal for: a reference; laser RTP (laser pulsed heating) without pretreatment and chlorine adsorption; pretreatment and chlorine adsorption without laser RTP; and a combination of pretreatment, chlorine adsorption and laser RTP. The reference implementation refers to when laser pulsed heating and chlorine adsorption are not performed. Film thickness ranges 1002, 1004, 1006, 1008 are shown providing example ranges for the thickness of the reference, the laser heating without pretreatment and chlorine adsorption, the pretreatment and chlorine adsorption without laser RTP, and the combination of the pretreatment, chlorine adsorption and laser RTP implementations. Chlorine adsorption with laser RTP removes material at a rate, for example, 10 times faster than without chlorine adsorption and laser RTP.

Figure 11:
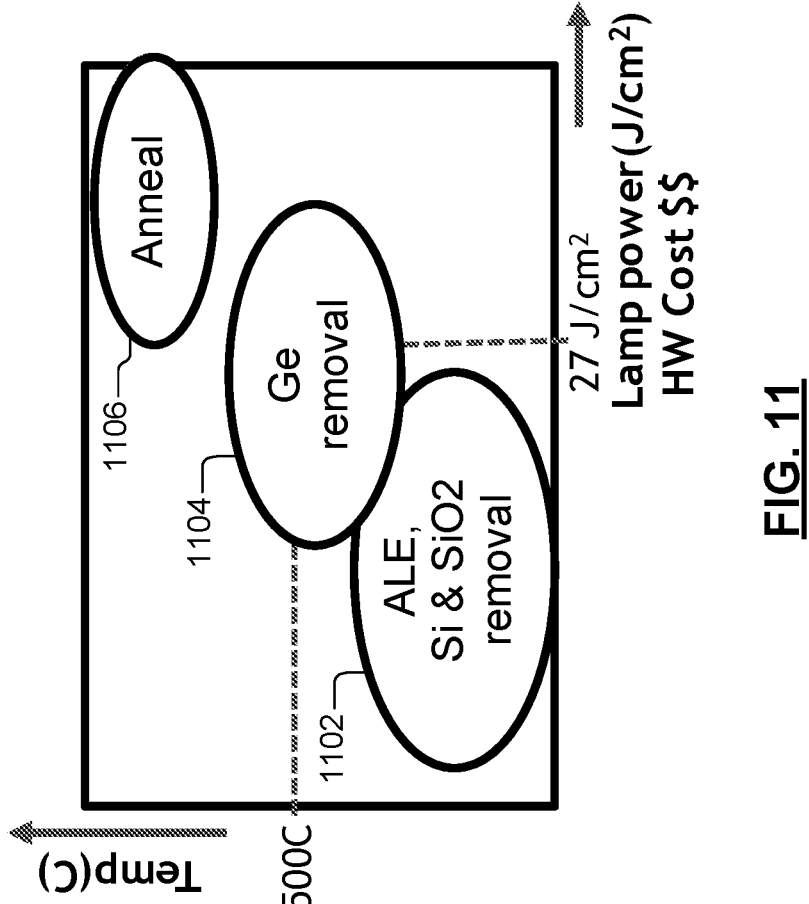
FIG. 11 is an example plot of estimated temperature ranges and lamp power ranges for certain processes.

FIG. 11 shows estimated temperature ranges and lamp power ranges for certain processes. The processes include: an ALE process for removal of Si or SiO$_2$, as represented by range 1102; a Ge removal process, as represented by 1104; and an annealing process including RTP, as represented by 1106. Ge removal is shown as being performed at about 500° C. and with a lamp power per unit area of 27 J/cm$^2$.

Figure 12:
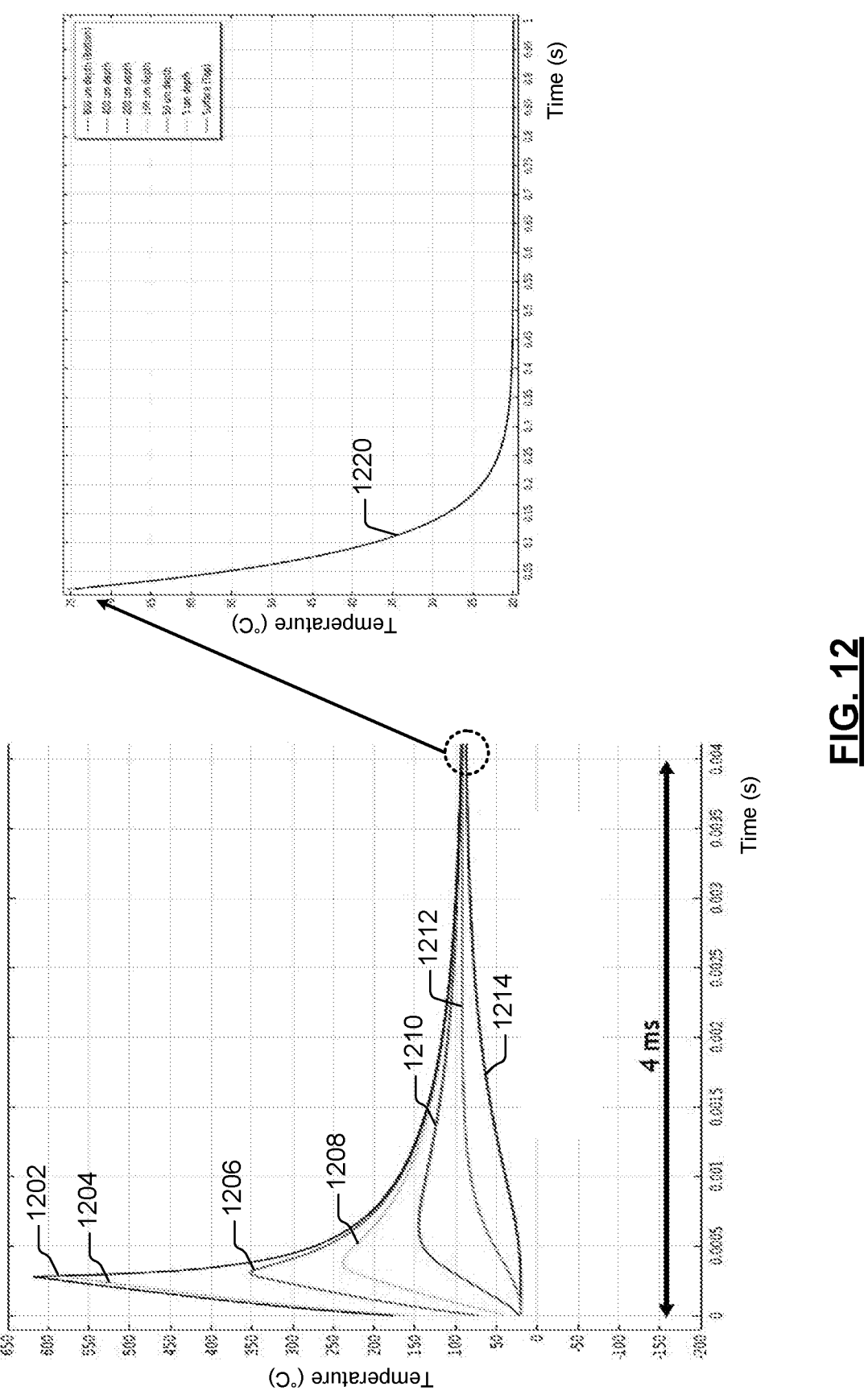
FIG. 12 is an example plot illustrating rates of surface temperature changes during a flash lamp cycle performed in accordance with the present disclose and a corresponding example plot of rates of surface temperature changes during a corresponding cool down period subsequent to the flash lamp cycle.

FIG. 12 shows rates of surface temperature changes during a flash lamp cycle performed in accordance with the present disclose and a corresponding example plot of rates of surface temperature changes during a corresponding cool down period subsequent to the flash lamp cycle. Rapid thermal pulse duration of less than 0.3 ms may be provided with heating for 600° C. of surface temperature. Curves 1202, 1204, 1206, 1208, 1210, 1212, 1214 illustrate temperature changes for depths respectively of surface (i.e. less than 1 μm), 5 μm, 50 μm, 100 μm, 200 μm, 400 μm and 800 μm. The curves 1202, 1204, 1206, 1208, 1210, 1212, 1214 are shown for a 4 ms period. Curve 1220 is shown to illustrate an amount of time to cool down the surface of the substrate to ambient (or room) temperature without active cooling after the 4 ms period. As shown, the cool down time may be 0.5 s. Multiple cycles may be performed as illustrated by the stated curves without increasing temperatures of a base (or bulk) portion of the substrate. Shorter pulse times and/or active cooling can further decrease recovery times and yet further prevent thermal budget issues from occurring.

Figure 13:
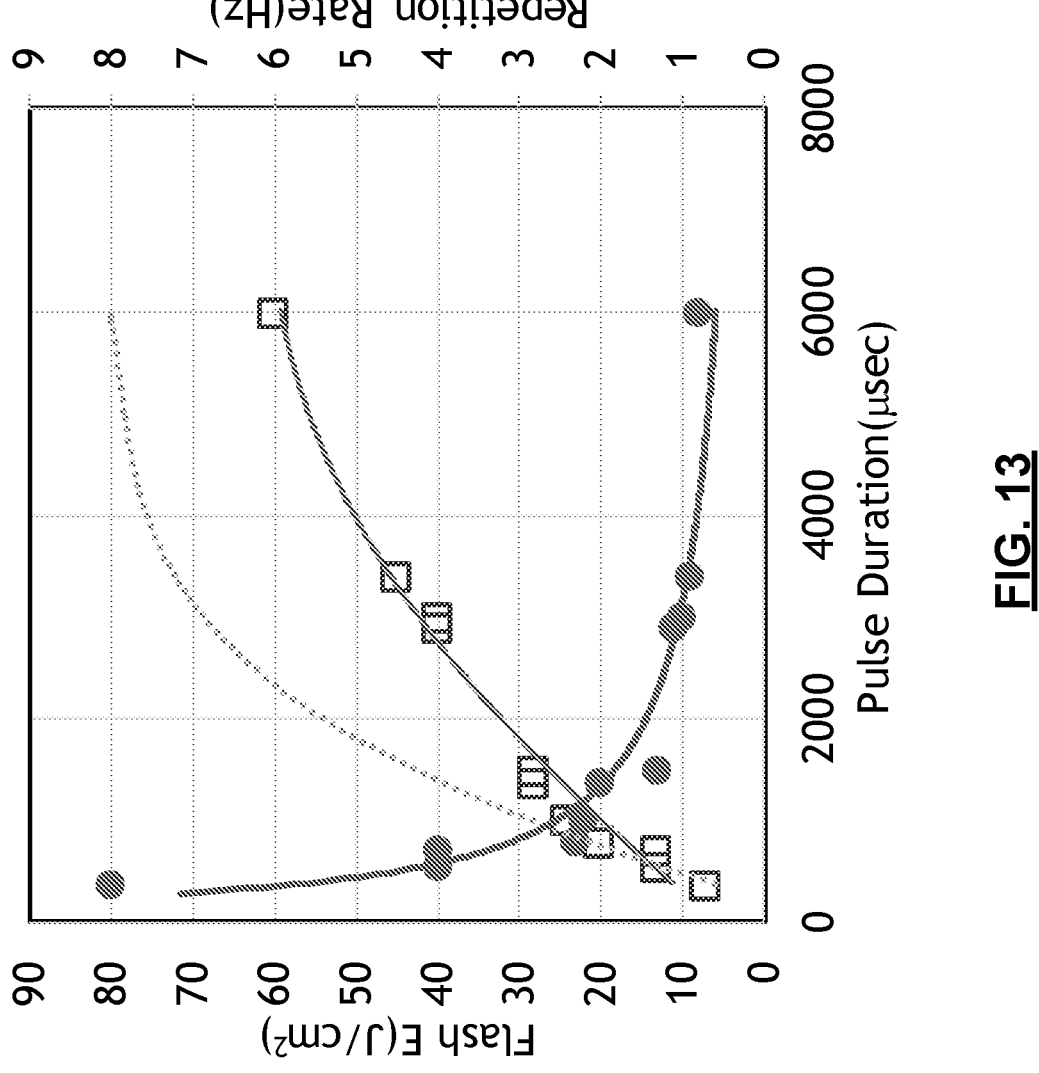
FIG. 13 is an example plot of flash lap power levels and repetition rates versus pulse durations for flash lamp cycles in accordance with the present disclosure.

FIG. 13 shows flash lamp power levels and repetition rates versus pulse durations for flash lamp cycles. The flash lamp power levels and repetition rates are provided for certain rapid thermal pulse durations. The repetition rates refer to a number of pulses per second (e.g., 2 pulses per second is 2 Hertz). A maximum flash lamp power may be 80 J/cm$^2$ and a maximum pulse duration may be 6000 μs. As an example, a rapid thermal process may include less than 30 J/cm$^2$ with less than a 3 ms duration. As another example, 20 J/cm$^2$ may be provided to increase surface temperature of a substrate 400-500° C.

Figure 14:
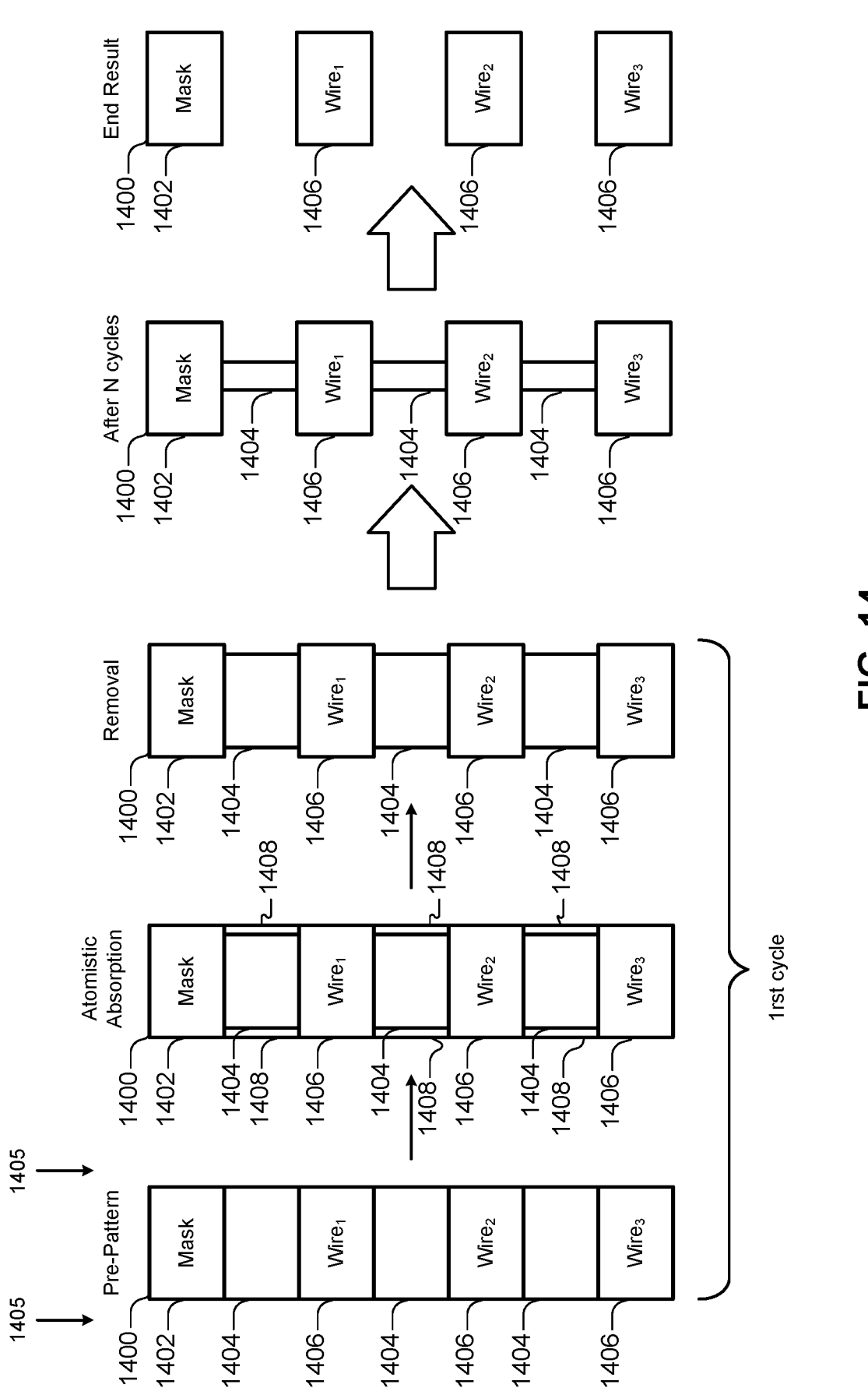
FIG. 14 is a diagram illustrating iteratively performed rapid thermal pulse cycles for removal of portions of dielectric layers in accordance with the present disclosure.

FIG. 14 shows a diagram illustrating iteratively performed rapid thermal pulse cycles for removal of portions of dielectric layers from a portion of a substrate. A stack of layers 1400 is shown from which portions of dielectric layers 1404 are removed during each cycle. The stack of layers 1400 is disposed between two trenches (represented by arrows 1405), which provides etching access to sides of the dielectric layers 1404. The substrate may have been previously etched or cut to provide the trenches. The stack of layers 1400 includes a mask layer 1402, dielectric layers 1404 (e.g., layers formed of Si), and conductive layers 1406 (e.g., conductive elements or wires formed of SiGe). Portions of the dielectric layers 1404 are removed during each cycle of the corresponding RTP process. For example, portions 1408 are removed during a first cycle. The portions 1408 may be respective monolayers of the dielectric layers 1404.

Traditionally, removal of portions of Si or Ge layers was done either by (i) an anisotropic plasma etch process, or (ii)

an isotropic digital etch process including an oxidation (or wet) operation and a removal (or wet or dry) operation. The anisotropic plasma etch process can cause layer damage and the isotropic digital etch process (or wet process) can result in layer pattern collapse in, for example, a center area of multiple layers due to tension from use of a wet chemical. A dry process may be performed instead of a wet process, however a dry process has corresponding risks of layer damage. These concerns are prevalent in nano-scale (or nano-wire) applications. For example, a stack of Si nano-wires extending over a predetermined distance may be 60 nm thick and be spaced 20 nm apart. When wet etching is performed, a center area between ends of the Si nano-wires may collapse, such that the gaps between the Si nano-wires are decreased to an extent that the Si nano-wires are in contact with each other.

The disclosed examples provide isotropic ALE with RTP to remove portions of layers without layer damage and/or pattern collapse. In one embodiment, multiple cycles of oxidation and removal of portions of, for example, Si layers using RTP is performed to provide gate-all-around (GAA) field effect transistors (FETs), which are formed from an original stack of layers. This process is a dry process and enables damage free high aspect ratio (HAR) atomistic etch rate control.

Figure 15:
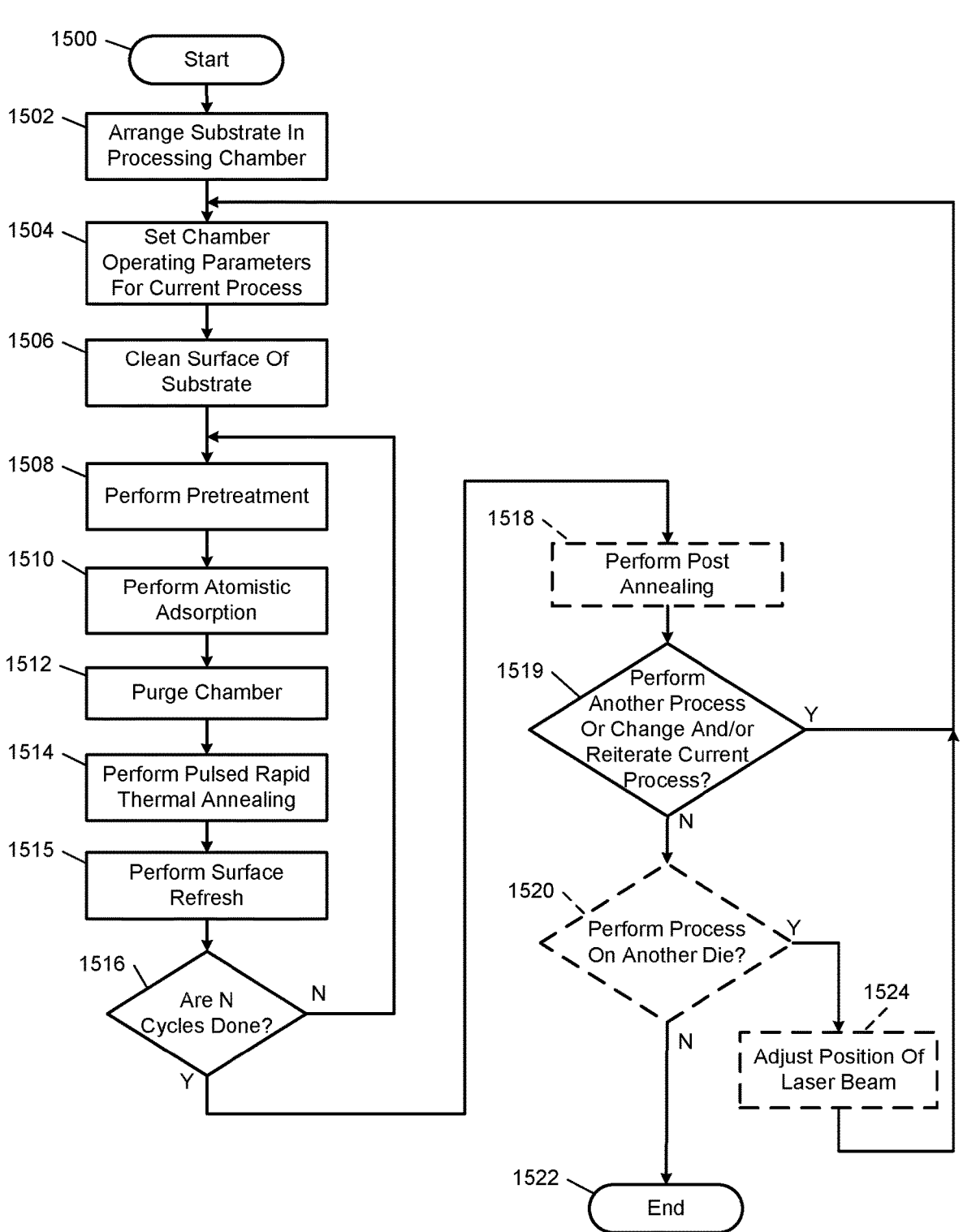
FIG. 15 illustrates an ALE method in accordance with the present disclosure.

The systems disclosed herein may be operated using numerous methods, an example method is illustrated in FIG. 15. FIG. 15 shows an ALE method implementing RTP as described herein. Although the following operations are primarily described with respect to the implementations of FIGS. 1 and 2, the operations may be easily modified to apply to other implementations of the present disclosure. The operations may be iteratively performed.

The method may begin at 1500. At 1502, a substrate (e.g., the substrate 112 of FIGS. 1 and 2 and/or a 300 mm diameter substrate) is arranged in a processing chamber. At 1504, chamber operating parameters such as substrate support temperatures, chamber pressures, RF power and bias power levels, and gas flow rates are set.

At 1506, a surface of the substrate is cleaned. As an example the substrate may include a Ge layer disposed on a Si layer. The top surface of the Ge lay may be cleaned.

At 1508, pretreatment may be performed including exposing the surface of the substrate with, for example $H_2$ plasma or $NH_3$ plasma, for de-chlorination and surface activation. As an example, a plasma gas mixture including hydrogen $H_2$ gas or ammonia $NH_3$ gas species is supplied to the processing chamber. In one embodiment, surface modification is performed without plasma, but by using gases having a preselected chemistry.

At 1510, atomistic adsorption is performed. This may occur at low temperatures (e.g., less than or equal to 20° C.) and include exposing the surface of the substrate to $O_2$, $Cl_2$, $I_2$, $NF_3$ or other reactant. In one embodiment, atomistic adsorption is performed at less than a room (or ambient) temperature. As an example, a non-plasma flow of $Cl_2$ may be provided. At 1512, the corresponding process chamber is purged of gases.

At 1514, pulsed rapid thermal annealing is performed using, for example, flash lamps, a laser or other suitable lamps (e.g., infrared lamps) capable of being rapidly pulsed as described herein. At least operations 1508-1515 may be iteratively performed including modulating surface (or upper portion) temperatures of the substrate. The temperature of the surface (or upper portion) may be modulated multiple times in a single second. Pulsed rapid thermal annealing is performed at 1514 for desorption/removal purposes. This may include generating one or more thermal energy pulses to heat the modified portion of the substrate. Temperatures may be increased to evaporate certain molecules.

Figure 16:
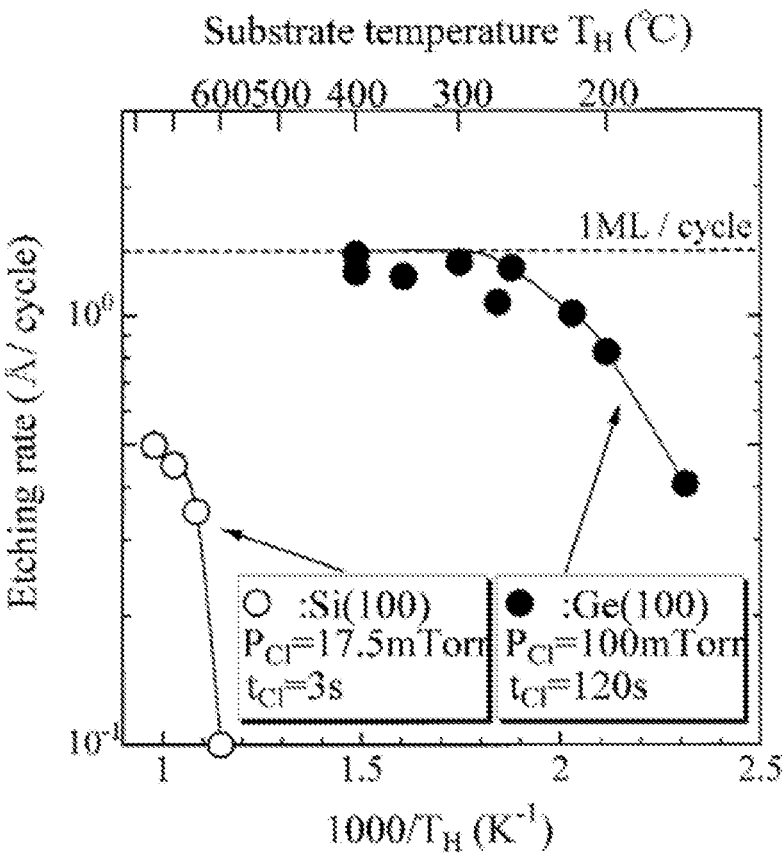
FIG. 16 is an example plot of etching rates versus substrate surface temperatures during an ALE process performed in accordance with the present disclosure.

A base and/or bulk of the substrate is maintained at or below a predetermined temperature (e.g., less than or equal to 20° C.) during operation 1514. $GeCl_2$ starts to sublime above 260° C. $SiCl_2$ starts to sublime above 650° C. In an application where a layer of Ge is disposed over a layer of Si, by applying a proper laser pulse or flash lamp pulse of energy, Ge can be selectively etched without etching Si with infinite selectivity. RTP enables one processing chamber configuration to be used with high throughput. Multiple processing operations may be performed in the single processing chamber. FIG. 16 shows a plot of etching rates for Ge and Si versus substrate surface temperatures during an ALE process performed as described. As another example, the pulses may be 0.1 ms in length and increase surface and/or a portion of the substrate up to 1000° C.

In some examples, each of the flash lamp pulses provides 10 $J/cm^2$ (i.e., energy per unit area of the substrate) to 80 $J/cm^2$. In some examples, each of the laser pulses provides 10 $mJ/cm^2$ to 80 $mJ/cm^2$. In some examples, the annealing is performed during a predetermined period in a range from 0.1 ms to 20 ms. In one embodiment, the flash lamp is used with pulse durations of 1 ms or the laser is used with pulse durations of 1 ps to heat the surface or upper portion of the substrate from an initial temperature to greater than 500° C. and then cooled down back to the initial temperature in less than 1 s.

Figure 17:
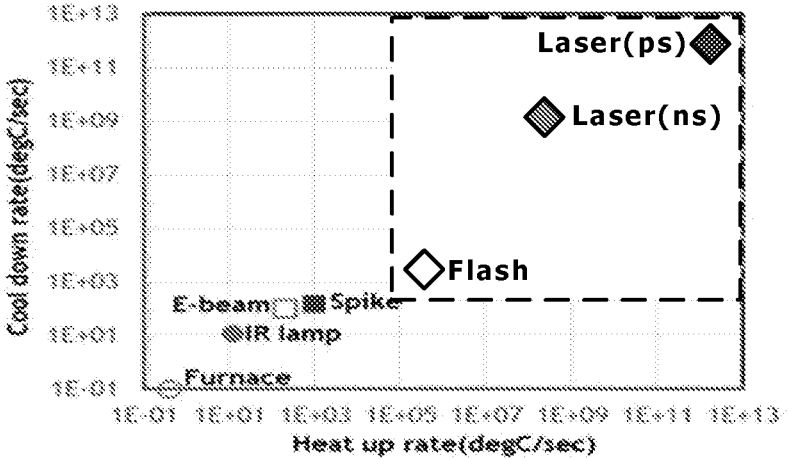
FIG. 17 is a plot illustrating example cool down rates versus heat up rates for different heat sources.

Operations 1508, 1510, 1514 allow for controllable atom by atom removal of an upper layer of the substrate that was modified during operations 1508 and 1510. The rapid heating performed at 1514 provides an isotropic reaction without use of plasma. In addition, the claimed heating allows for rapid cool down, which also prevents thermal budget issues. FIG. 17 shows example cool down rates versus heat up rates for different heating sources and corresponding methods. FIG. 17 shows that the disclosed flash lamp and laser heating methods provide quicker heat up rates and cool down rates, as compared to other furnace, IR lamp, Electron (E)-beam, and spike methods.

At 1515, the surface of the substrate may be refreshed by purging the process chamber with a purge gas (e.g., argon Ar gas) to perform ion bombardment and remove the modified portion(s) of the substrate. In one embodiment, the processing chamber is purged between one or more consecutive pairs of provided rapid thermal pulses. In an embodiment, the gases are purged from the processing chamber between each consecutive pair of pulses. This enables performance of multiple plasma and/or gas phase processes within the processing chamber. In an embodiment, substrate support cooling is provided during and/or subsequent to pulsed rapid thermal annealing to aid in maintaining temperatures of the base and/or bulk of the substrate during pulsed rapid thermal annealing and to aid in rapid cooling of the substrate subsequent to performing pulsed rapid thermal annealing.

At 1516, the controller 180 or 208 and/or rapid thermal pulse controller 182 or 210 determines whether N cycles have been completed. If N cycles have been completed, operation 1518 is performed, otherwise operation 1508 is performed. At 1518, the controller 180 or 210 may optionally perform a second (or post) annealing operation. At 1519, the controller 180 or 210 may determine, for a current die, whether to perform another process and/or whether to change and/or reiterate a current process. If another process is to be performed, operation 1504 may be performed, otherwise operation 1520 may be performed if a laser and a lens circuit is utilized as in the embodiment of FIG. 2. If flash lamps are used as in the embodiment of FIG. 1, the method may end at 1522 if another process or a change in a current process is not performed. If a process is to be performed on another die, operation 1524 is performed, otherwise the method may end at 1522.

At 1524, the controller 208 moves the mirrors 214, 216 to change an image plane position of a laser beam to be over a different die of the substrate 112. As an example, a 2 cm×2 cm laser beam may be moved from being over a first die to being over a second die. The described method may be iteratively performed to scan the laser beam over tens to hundreds of dies on the substrate. Movement of the mirrors 214, 216 may be synchronized with a pulsing repetition rate of the laser 204 to provide one or more shots per die.

The above-described operations are meant to be illustrative examples. The operations may be performed sequentially, synchronously, simultaneously, continuously, during overlapping time periods or in a different order depending upon the application. Also, any of the operations may not be performed or skipped depending on the implementation and/or sequence of events.

Although the method of FIG. 15 is described for performing ALE using the systems of FIGS. 1-2, the systems of FIGS. 1-2 may be used to perform ALD. The heat sources, such as the flash lamps and the laser, may be used to grow monolayers on substrates. For example, RTP may be provided prior to and/or during deposition operations and material may be deposited (or grown) rather than removed. Different gases may be provided and maintained in a corresponding processing chamber during ALD to allow for growth of the monolayers.

Figure 18:
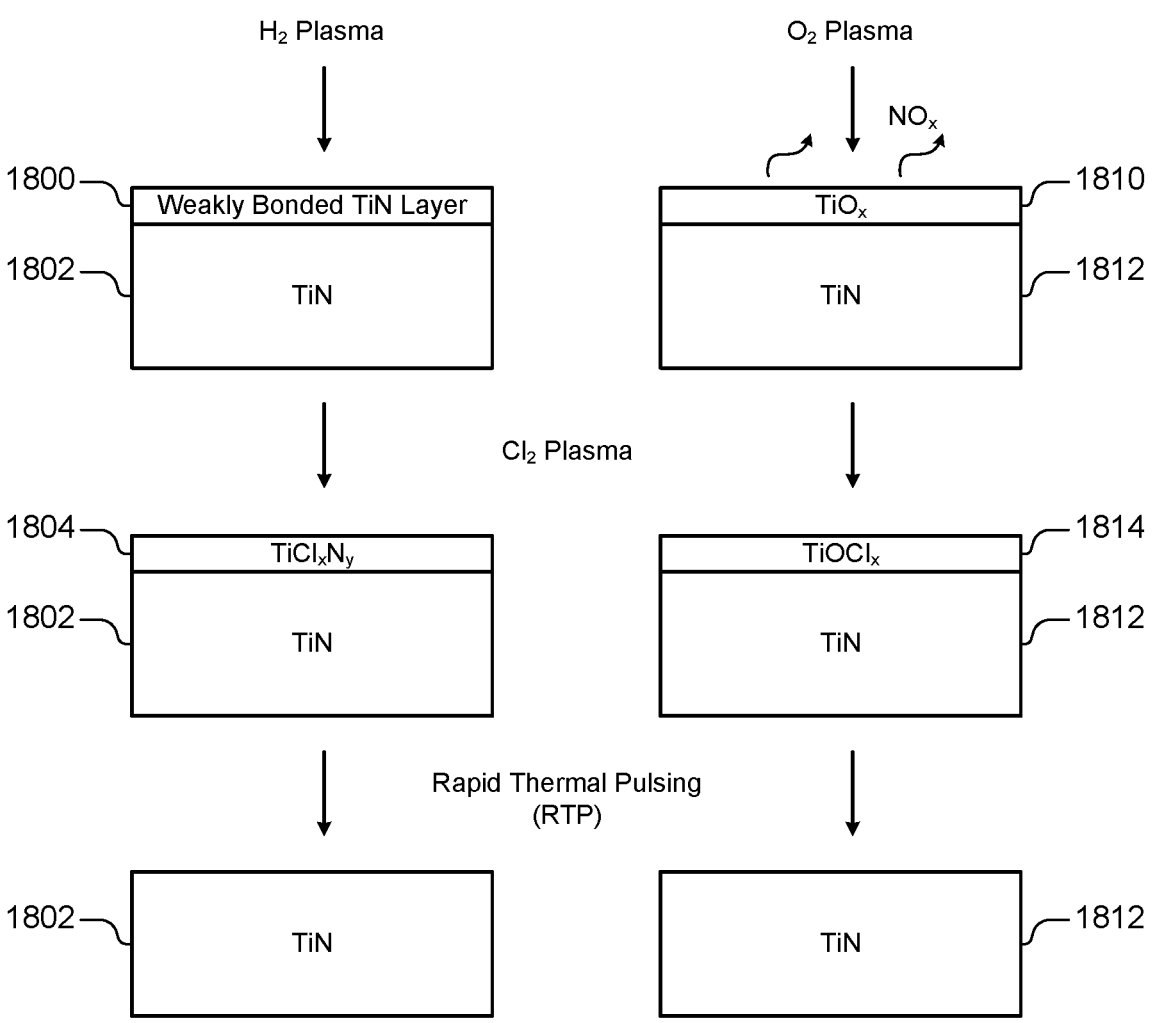
FIG. 18 is a block diagram illustrating two example ALE methods of removing layers of titanium nitride in accordance with the present disclosure.

FIG. 18 is a block diagram illustrating two example ALE methods of removing monolayers of TiN. The methods of FIG. 18 may be performed using the systems of FIGS. 1-2. The first method includes providing $H_2$ plasma as a pretreatment operation to alter an upper portion of a TiN layer or substrate and provide a weakly bonded TiN layer 1800 on a remainder 1802 of the TiN layer or substrate. $Cl_2$ plasma is then provided to perform atomistic adsorption to convert the weakly bonded TiN layer 1800 to a $TiCl_xN_y$ layer 1804. $TiCl_xN_y$ is a volatile complex compound. RTP is then performed to remove the $TiCl_xN_y$ layer 1804.

As an example, a cycle may include: providing $H_2$ plasma for 13 s including providing $H_2$ gas and Ar gas each at a flow rate of 90 standard cubic centimeters (sccm) and at a pressure of 180 milli-Torr (mT); providing $Cl_2$ plasma for 25 s including providing $Cl_2$ at a flow rate of 100 sccm and at a pressure of 400 mT; performing a purge operation for 30 s subsequent to the atomistic adsorption operation and prior to the RTP operation; and performing the RTP operation including providing 5 pulses, each of which at x mJ/cm². In an embodiment, x is 21. In one embodiment, this cycle is performed a predetermined number of times (e.g., 30 times). Table 2 below shows for this method: an example film thickness prior to performing atomistic adsorption with $Cl_2$ and/or performing RTP; and example film thicknesses resulting from performing atomistic adsorption with $Cl_2$ and/or RTP.

TABLE 2

| Process | Before (nm) | After (nm) | ER (Å/cycle) |
|---|---|---|---|
| Laser RTP Only | 92.8 | 89.4 | 1.1 |
| $Cl_2$ only | 92.8 | 89.9 | 1.0 |

TABLE 2-continued

| Process | Before (nm) | After (nm) | ER (Å/cycle) |
|---|---|---|---|
| $Cl_2$ and laser RTP | 92.8 | 81.2 | 3.9 |

Figure 19:
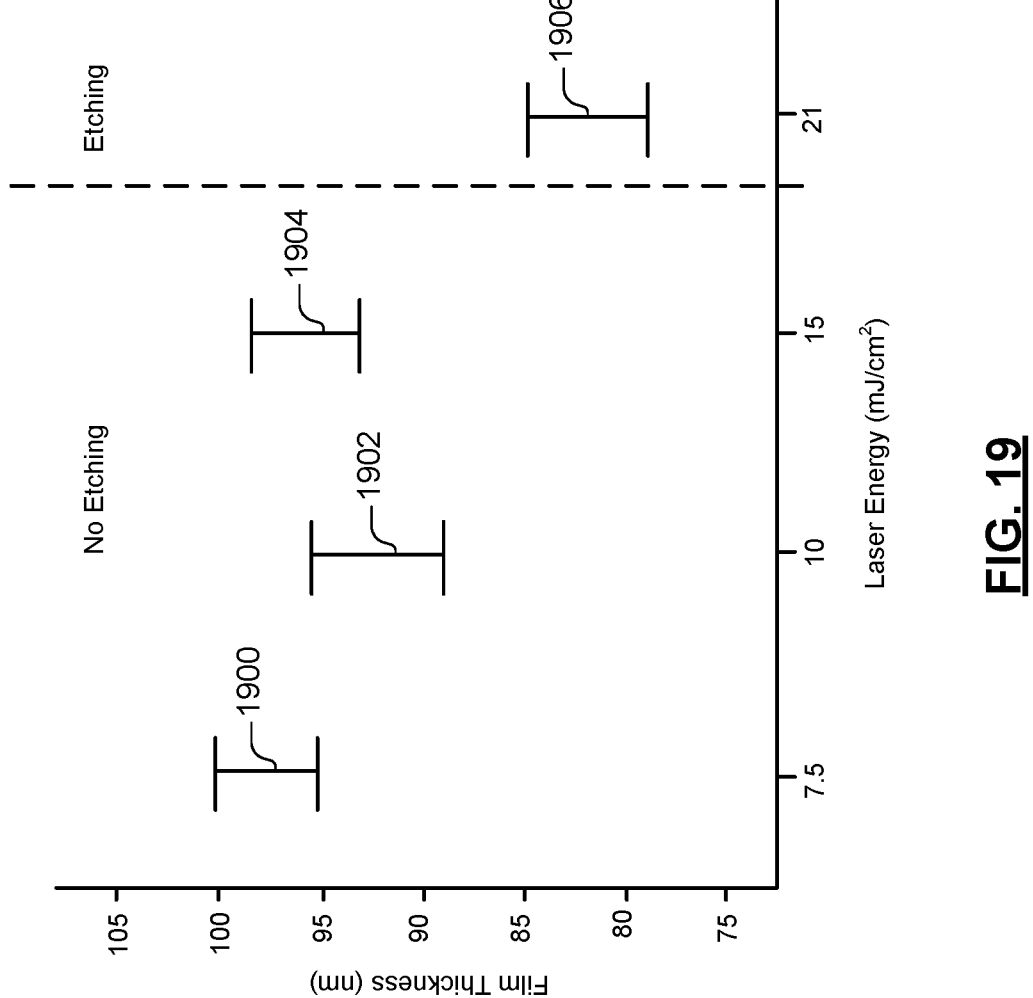
FIG. 19 is an example plot of titanium nitride film thicknesses for different energy levels.

FIG. 19 shows an example plot of TiN film thicknesses for different energy levels. Etching occurs at laser energy of greater than or equal to 20 mJ/cm². Thus, etching occurs at a power level of 21 mJ/cm2 and range 1906 is below ranges 1900, 1902, 1904.

Figure 20:
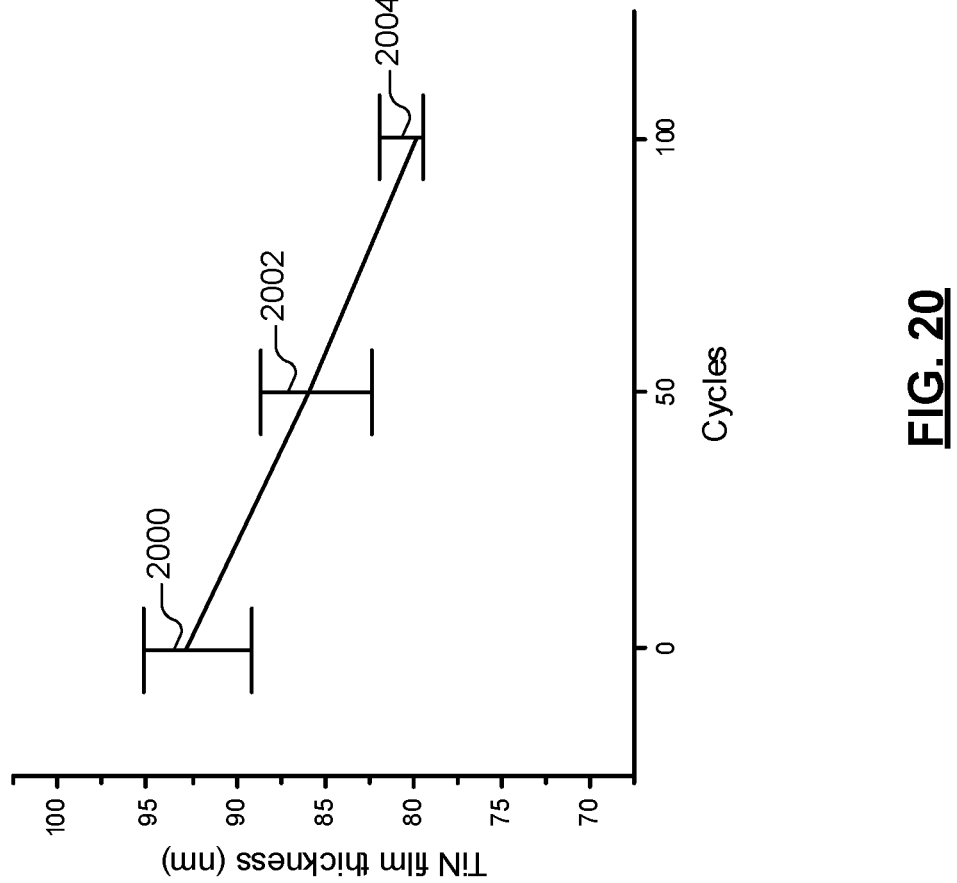
FIG. 20 is an example plot of titanium nitride film thicknesses versus different numbers of ALE cycles performed in accordance with the present disclosure.

Referring again to FIG. 18, the second method includes providing $O_2$ plasma as a pretreatment operation to alter an upper portion of a TiN layer or substrate by removing nitrogen as nitrogen oxide ($NO_x$) to provide a $TiO_x$ layer 1810 on a remainder 1812 of the TiN layer or substrate. $Cl_2$ plasma is then provided to perform atomistic adsorption to convert the $TiO_x$ layer 1810 to a titanium sub-oxychloride ($TiOCl_x$) layer 1814. $TiOCl_x$ is a volatile complex compound. RTP is then performed to remove the $TiOCl_x$ layer 1814. As an example, a cycle may include: providing $O_2$ plasma for 5 s including providing $O_2$ gas and Ar gas each at a flow rate of 90 standard cubic centimeters (sccm) and at a pressure of 180 milli-Torr (mT); providing $Cl_2$ plasma for 25 s including providing $Cl_2$ at a flow rate of 100 sccm and at a pressure of 400 mT; performing a purge operation for 30 s subsequent to the atomistic adsorption operation and prior to the RTP operation; and performing the RTP operation including providing 5 pulses, each of which at x mJ/cm². As an example, for the second method, an example film thickness prior to performing the second method is 93 nm and after performing 100 cycles of the second method is 79.6 nm. The corresponding etch rate may be 1.32 Å per cycle. FIG. 20 shows an example plot of TiN film thicknesses versus different numbers of ALE cycles performed. Ranges 2000, 2002, 2004 are shown as examples for 0, 50, and 100 cycles performed.

The two stated methods are isotropic ALE processes. In one embodiment, these methods provide etch rates of 1.5-2.0 Å per cycle. A 2.0 Å per cycle etch rate is 10 times faster than an oxidation-fluorination etch process of TiN. The etch depth may be controlled by controlling the number of cycles of the stated methods that are performed and/or the plasma power levels. The two methods as above-described include light irradiation/pulsed thermal sources enabling isotropic removal during ALE processes. The methods may be modified to perform two anisotropic ALE processes by applying plasma during RTP and introducing a bias voltage via one or more electrodes in a substrate support. For example, a bias voltage may be provided via the electrode 118 of the substrate support 110 of FIG. 1. In addition, bias power to one or more electrodes in the substrate support may be controlled to control ion directionality to enable control of isotropy.

Figure 21:
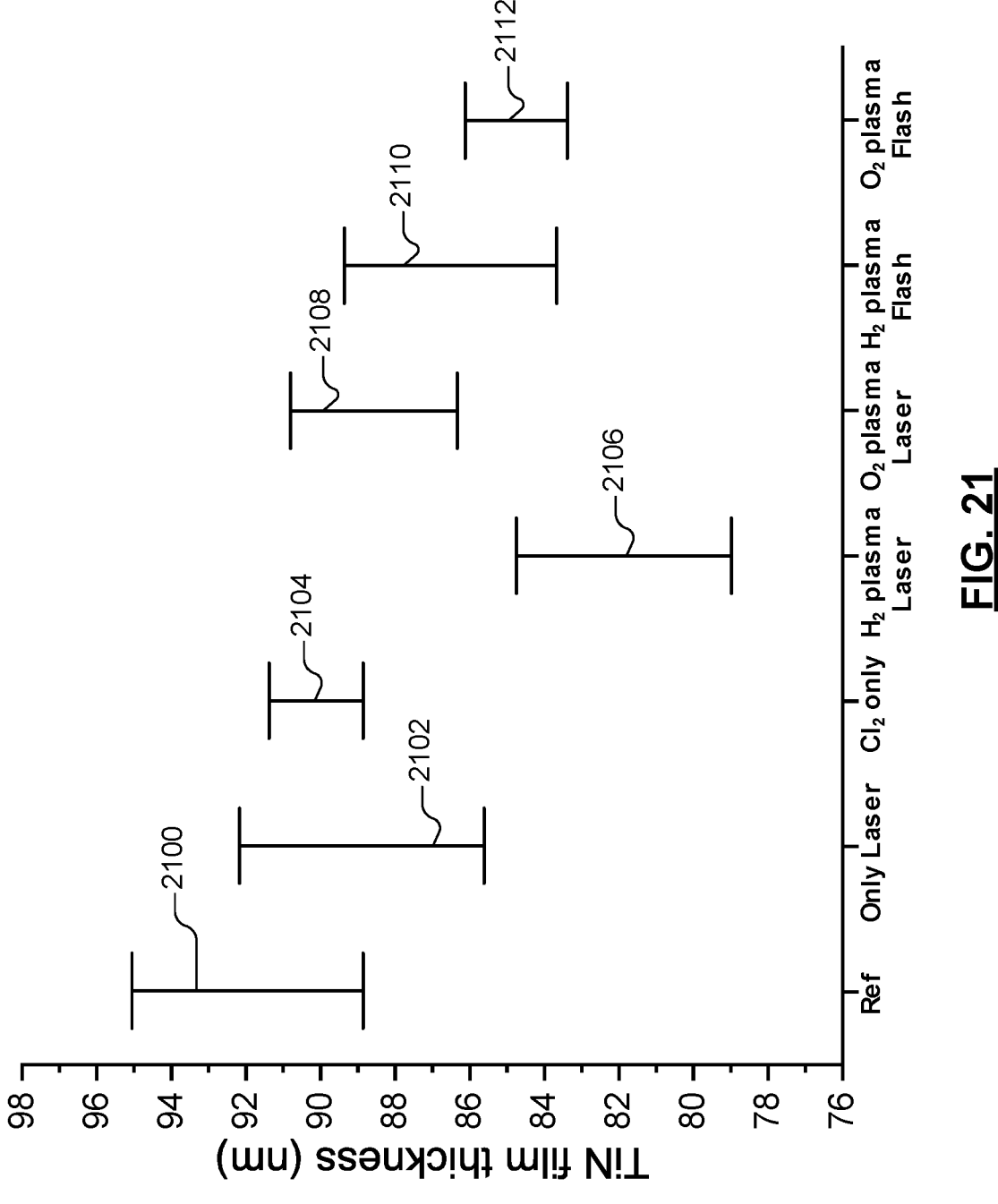
FIG. 21 is an example plot of titanium nitride film thicknesses illustrating different amounts of material removal for different operations performed.

FIG. 21 is an example plot of TiN film thickness ranges illustrating different amounts of material removal for different operations performed. TiN film thickness ranges 2100, 2102, 2104, 2106, 2108, 2110, 2112 are shown respectively for: a reference; laser RTP without pretreatment and atomistic adsorption (or "only laser"); atomistic adsorption with $Cl_2$ without pretreatment and laser RTP; $H_2$ plasma pretreatment and laser RTP; $O_2$ plasma pretreatment and laser RTP; $H_2$ plasma pretreatment with flash lamp RTP; and $O_2$ plasma pretreatment with flash lamp RTP. As an example and for 30 cycles, etch rates of TiN for $H_2$ plasma pretreatment and laser RTP, $O_2$ plasma pretreatment and laser RTP, $H_2$ plasma pretreatment with flash lamp RTP, and $O_2$ plasma pretreatment with flash lamp RTP may be respectively 3.9 Å per cycle, 1.4 Å per cycle, 2.0 Å per cycle and 2.4 Å per cycle.

Figure 22:
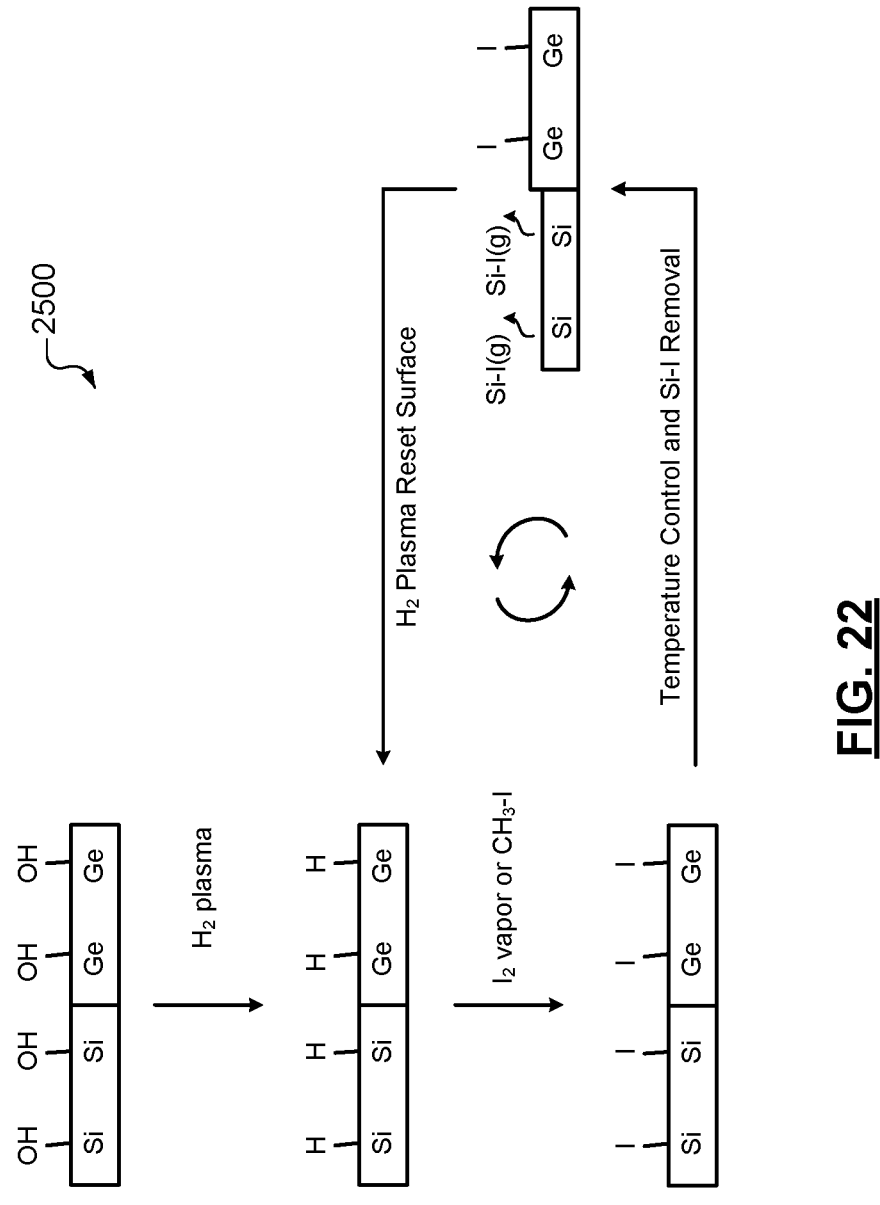
FIG. 22 is an example ALE process diagram illustrating introduction of iodine gas and removal of silicon without removal of germanium in accordance with an embodiment of the present disclosure.

FIG. 22 shows an ALE process diagram 2500 illustrating introduction of iodine gas and removal of silicon without removal of germanium. The ALE process shown is similar to the ALE process described above with respect to FIG. 6. The ALE process shown in FIG. 25 includes beginning with silicon and germanium layers, which may be stacked or arranged side-by-side as shown, which have formed bonds with hydroxide OH. Hydrogen $H_2$ plasma is then introduced during pretreatment to remove the oxygen elements, as shown. Subsequent to pretreatment, a halogen (e.g., iodine gas) is introduced. Halogen species (or iodine) bonds (e.g., Si—I and Ge—I molecules) are then formed with the silicon and germanium layers. As an alternative, a hydrocarbon (e.g., $CH_3$) may be introduced instead of iodine.

Subsequent to forming the Si-halogen or Si-hydrocarbon molecules, temperatures of the silicon and germanium layers are increased to remove the Si-halogen or Si-hydrocarbon molecules. This may be done by (i) heating a corresponding substrate support to heat the substrate including the silicon and germanium layers, and/or (ii) heating the substrate using a laser or a heat lamp, as described herein. Sublimation of $SiI_x$ occurs at approximately 110° C. Sublimation of $GeI_x$ begins at approximately 350° C. The silicon and germanium layers may thus be heated to approximately 100-130° C. to selectively remove the $SiI_x$ molecules and not the $GeI_x$ molecules. The heating may include RTP heating as described herein. Subsequent to removing the Si-halogen or Si-hydrocarbon molecules, hydrogen plasma may again be introduced and the cycle may be repeated.

Figure 23:
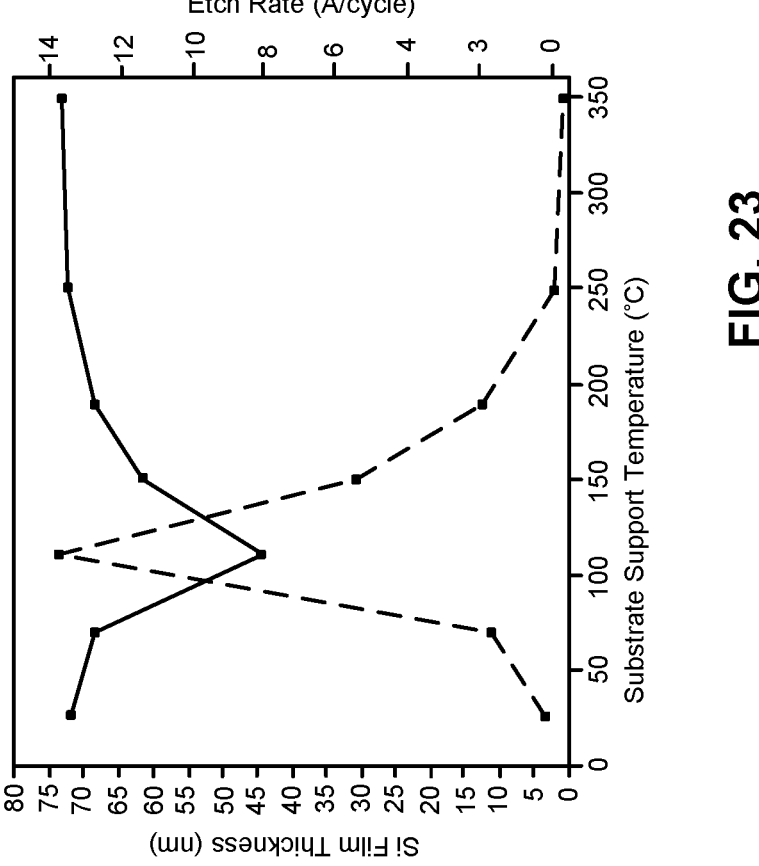
FIG. 23 is an example plot of silicon layer thickness relative to etch rates for different substrate support temperatures.
Figure 26:
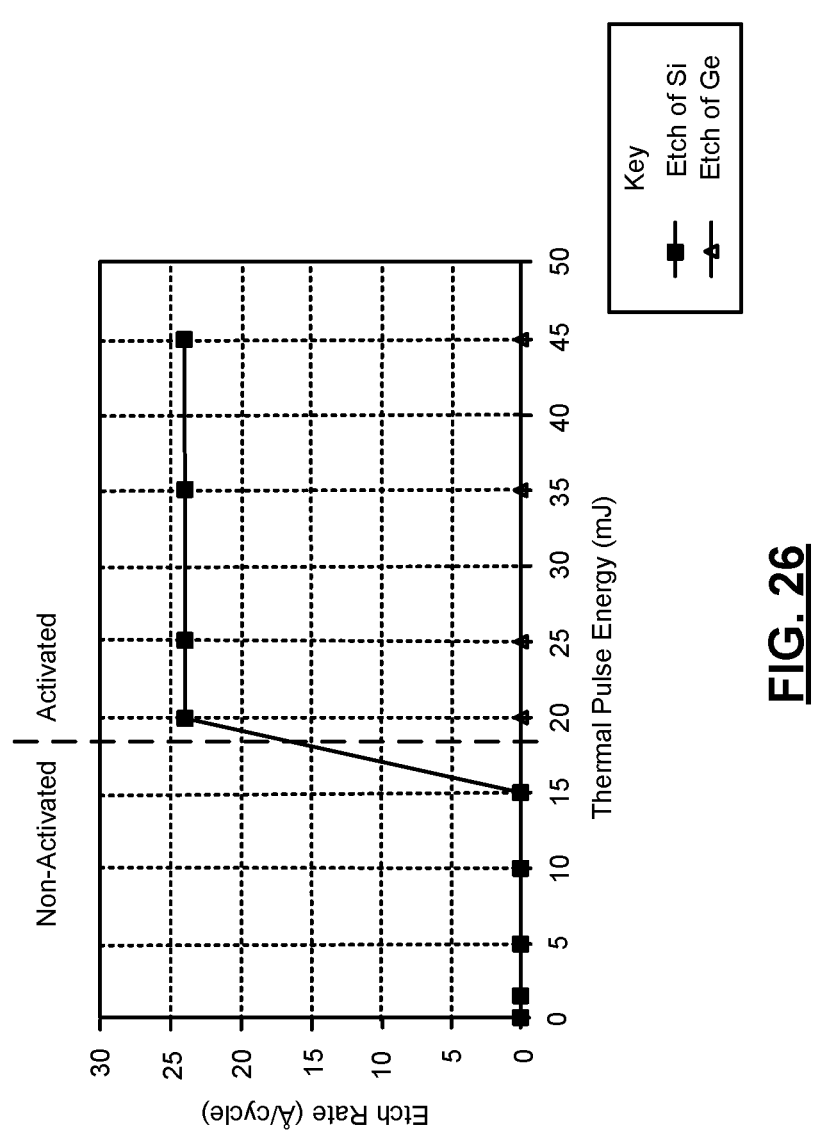
FIG. 26 is an example plot of etch rates versus thermal pulse energy for silicon and germanium using iodine gas.

FIG. 23 shows a plot of silicon layer thickness relative to etch rates for different substrate support temperatures. The plots are shown for etching $SiI_x$ molecules. As can be seen from the plots, a peak etch rate occurs when the temperature of the substrate support and thus the substrate, having a layer including $SiI_x$ molecules, is at approximately 110° C. The amount of material removed is maximized at this temperature. As an example, the plots of FIG. 23 are provided for an ALE process cycle that includes introduction of hydrogen followed by introduction of iodine gas (or iodine plasma), and subsequently performing a purge using, for example, argon gas. The plots of FIG. 26 are also based on heating the substrate by heating the substrate support using, for example, heaters 116 of FIG. 1. A laser and/or a flash lamp were not used to heat the substrate.

Figure 24:
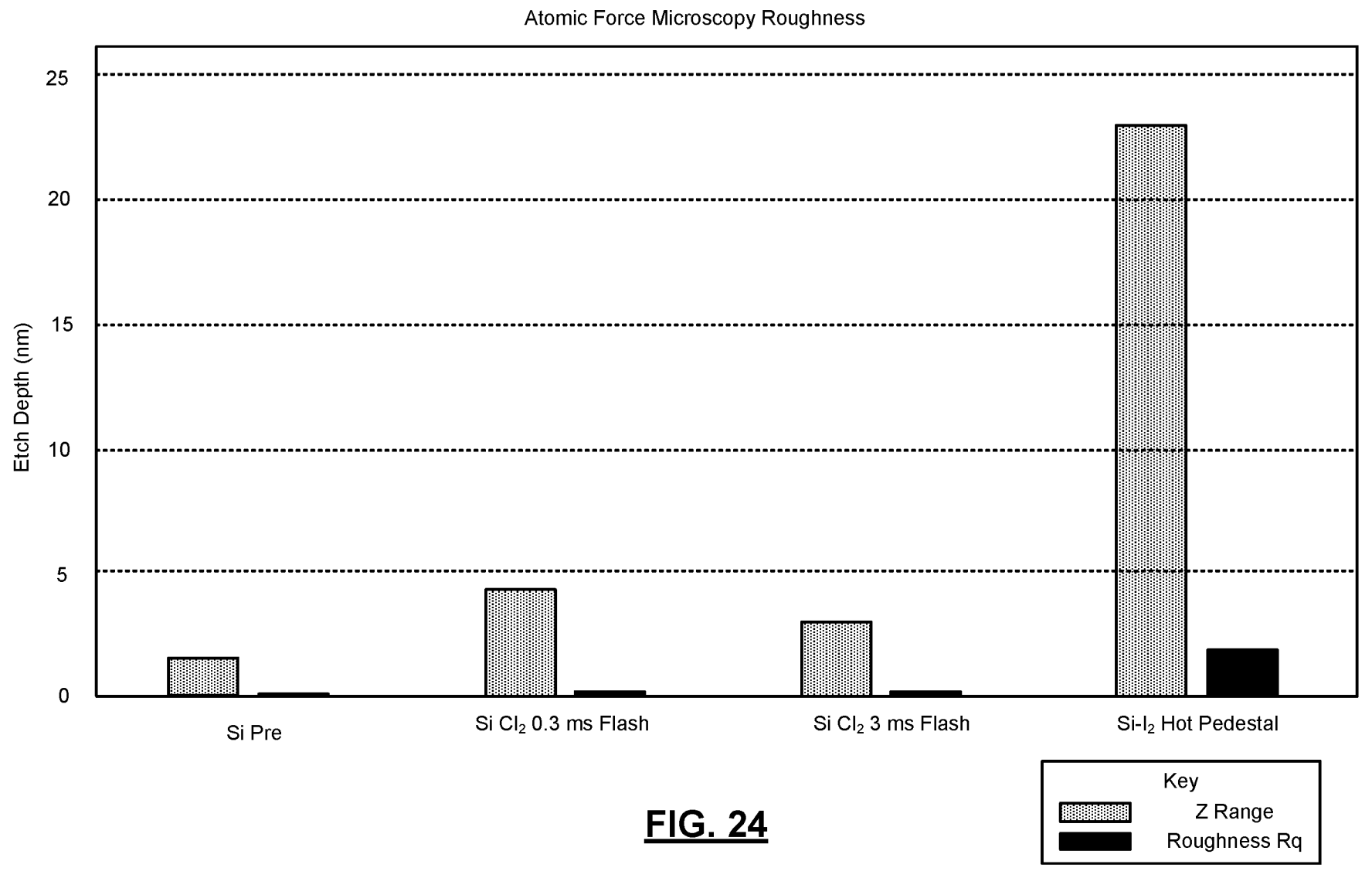

FIG. 24 shows a graph of etch depth ranges and surface roughness associated with measurements of samples taken prior to heating (referred to as Si Pre), subsequent to flash lamp heating for different energy levels (referred to as Si $Cl_2$), and subsequent to substrate support heating. As shown, the Z range (or distance between physical uppermost and bottommost points of the Si layer) and the surface roughness Rq are lowest prior to etching. However, when the substrate support is heated via, for example, the heating elements 116 of FIG. 1 and iodine is introduced, the Z range and surface roughness Rq are significantly higher than if a chlorine etch is performed using a flash lamp to heat the substrate. Two sets of bars are shown for two test of chlorine etching using a flash lamp; the first test was performed for 0.3 ms and more thermal energy than the second test, which was performed for 3 ms and less thermal energy. The difference between these two sets of bars is negligible. As an example, the bars for Si—$I_2$ are provided for an ALE process cycle that includes introduction of hydrogen followed by introduction of iodine gas (or iodine plasma), and subsequently performing a purge using, for example, argon gas.

Figure 25:
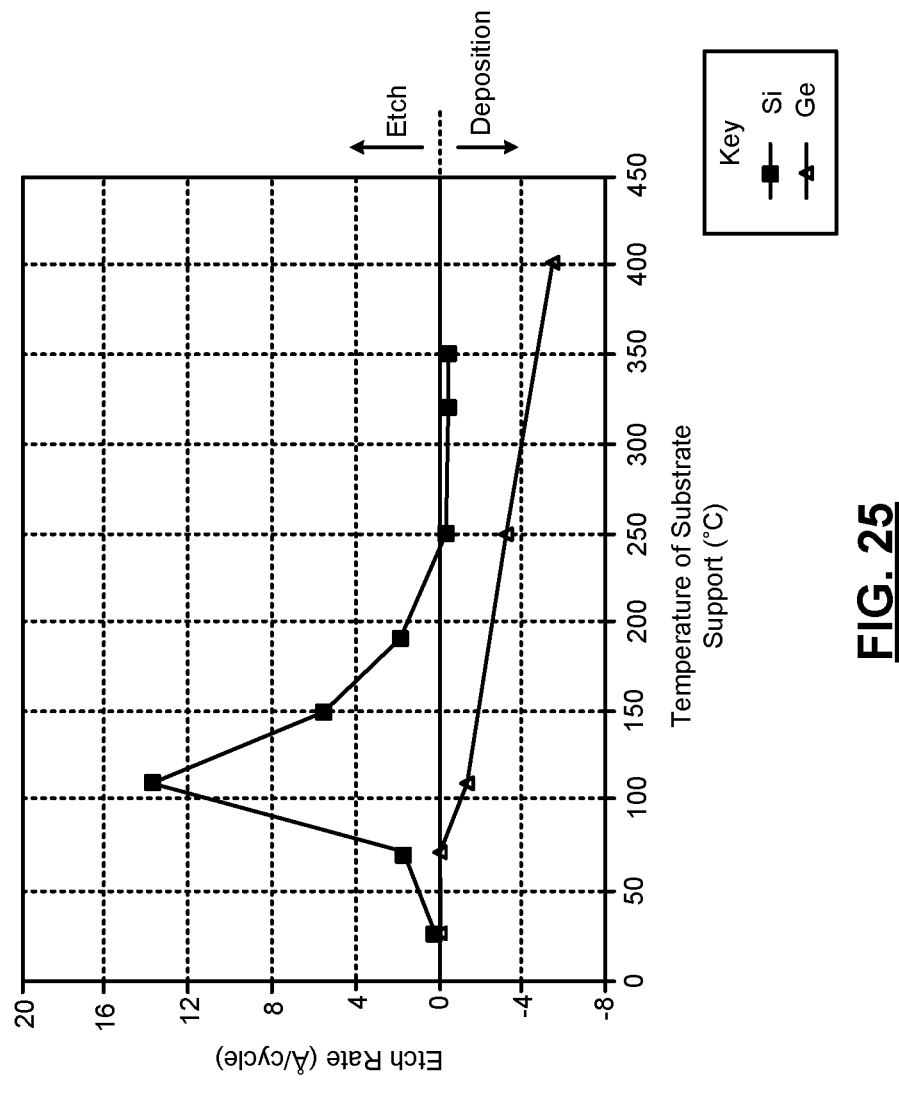
FIG. 25 is an example plot of etch rates of silicon and deposition rates of germanium due to introduction of iodine gas and a heated substrate support.

FIG. 25 shows a plot of etch rates of silicon and deposition rates of germanium due to introduction of iodine plasma with a heated substrate support. As can be seen from the plot, etch rate of silicon is at a maximum when the substrate support and/or substrate is at around 110° C. Although not shown in the plot, etch rate for germanium can increase when temperature of the substrate support is increased above approximately 300° C. Depending on the temperature of the substrate, a 10-to-1 selectivity ratio of etching rate of silicon versus etch rate of germanium may exist. In the plot, etch rate for germanium is shown for when the substrate support is at room temperature and is approximately 0. Deposition of germanium begins approximately above 70° C.

The above-described ALE process using flash lamp or laser heating and introduction of iodine as a halogen provide highly selective ALE to remove silicon and not germanium with high throughput. This ALE process has improved thickness control over plasma etching and is compatible for high aspect ratio (HAR) etching. In one embodiment, pulsed thermal flash lamp or laser heating is provided to increase the substrate temperature above 100-290° C. to desorb Si—I bonds while the Ge—I bonds remain. Desorption of the Ge—I bonds does not occur until the temperature of the substrate is above 300-440° C. A few examples of species that may be introduced instead of iodine are $CH_3I$, $CH_3I_3$, $C_2H_5I$, $CH_2I_2$, and other $C_xH_yI_z$ molecules.

FIG. 26 shows a plot of etch rates versus thermal pulse energy for silicon and germanium using iodine plasma. As shown, the etch rate for silicon is increased starting at 15 milli-joules mJ), such that activation occurs at approximately 18 mJ. As shown, the etch rate of germanium is 0 for energy levels less than or equal to 45 mJ. This method of etching is a self-limiting process in that after a certain number of rapid thermal pulses, all or most of a surface modified during adsorption has been removed during desorption.

Figure 27:
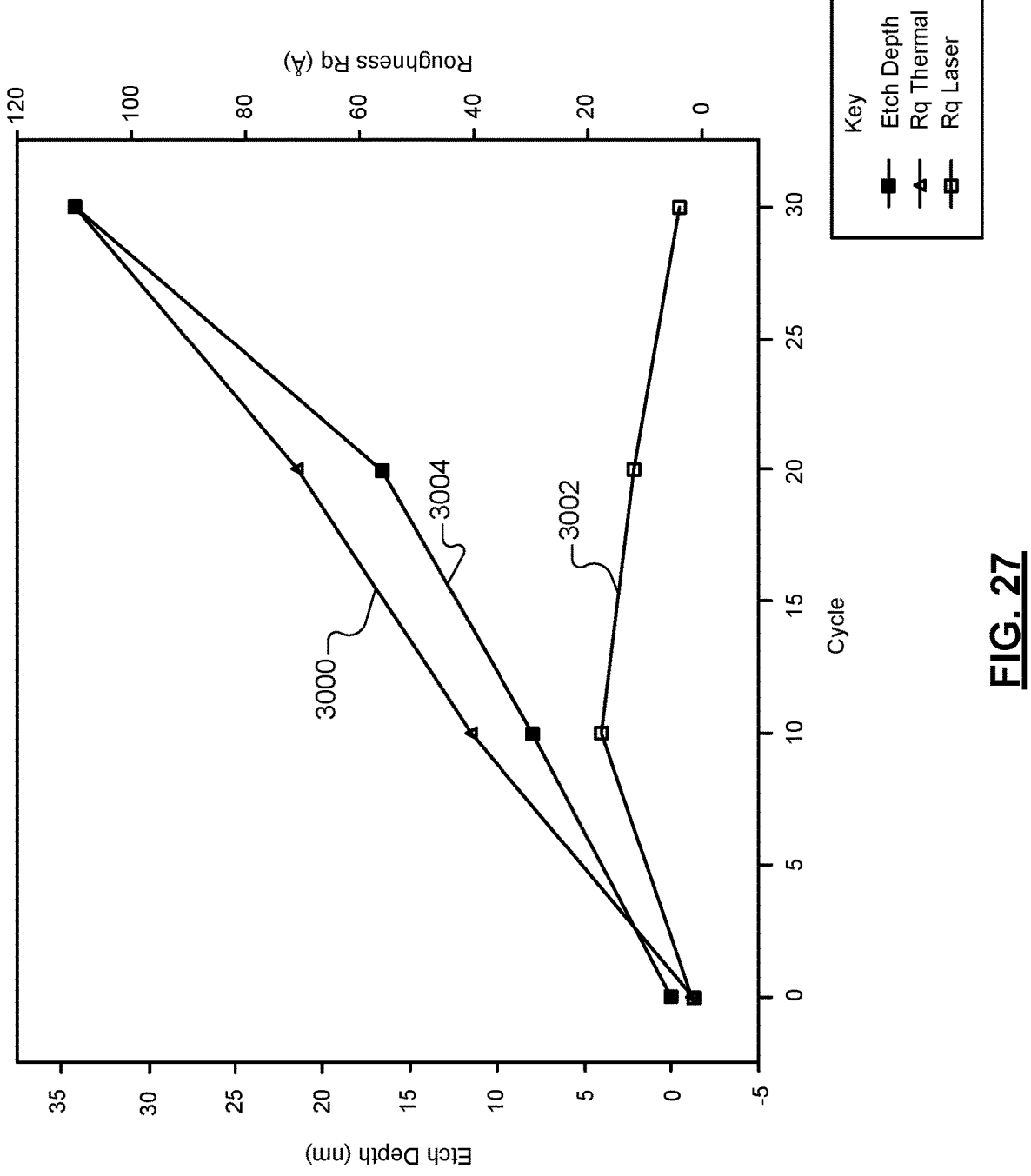

FIG. 27 shows a plot of etch depth and surface roughness for a heated substrate support implementation and a laser implementation. A first surface roughness curve 3000 is shown for thermal heating of a substrate support via, for example, heating elements 116 of FIG. 1. A second surface roughness curve 3002 is shown for laser heating of a substrate support as described herein. An etch rate curve 3004 is shown, which applies to both of the curves 3000, 3002 and thus the thermal heating via internal heating elements of the substrate support or heating of a substrate via a laser. As shown, the roughness is considerably more using internal heating elements or other internal heating method, such as heat a fluid circulating through internal heating channels of the substrate support, than when heating the substrate using the laser. In addition, the laser heating removes a high percentage of the modified layer (e.g., Si—$I_2$ bonds) after approximately 10 cycles, where each cycle includes 11 mJ of energy and 5 pulses.

Figure 28:
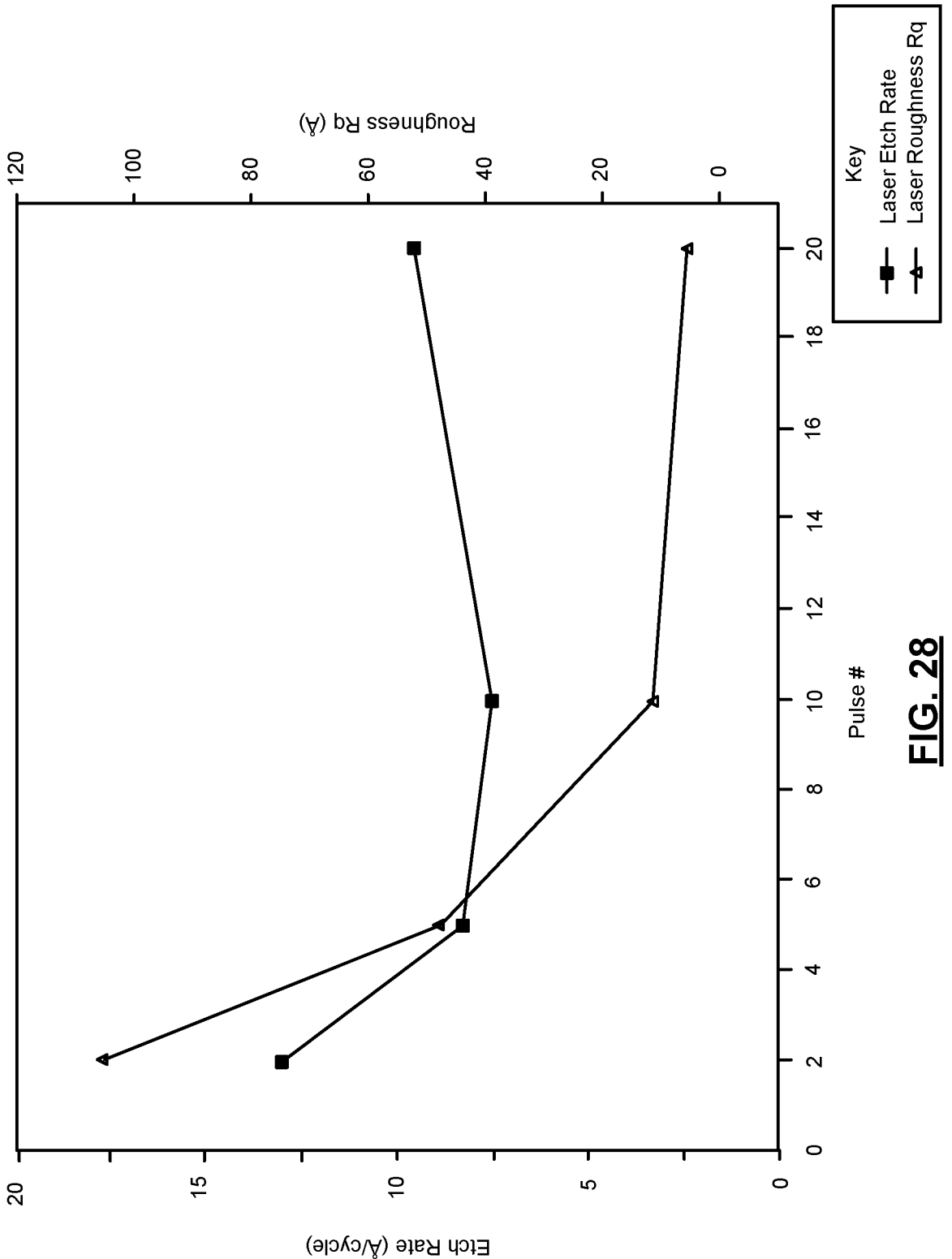
FIG. 28 is an example plot of etch rates and surface roughness relative to a number of pulses for substrate heating via a laser in accordance with an embodiment of the present disclosure.

FIG. 28 shows a plot of etch rates and surface roughness relative to a number of pulses for substrate heating via a laser. As shown, the etch rate decreases as the number of pulses increase until approximately 5 pulses are reached. As shown, the surface roughness decreases with an increased number of pulses and has minimal change after a certain number pulses (e.g., 10 pulses). This is because a high percentage of material that has been modified is removed after the predetermined number of pulses have occurred. Using a pulsed laser to remove modified material is a self-limiting process, such that after a certain number of pulses all modified material is removed. For the example shown, a temperature of the substrate support was at room temperature and thus was not heated. Laser pulse energy was set at 11 mJ.

The above-described examples include the selective etching of silicon, not germanium. The examples provide high selective ALE with high throughput with improved layer thickness control. Pulsed laser operation allows for plasma or gas phase processes in-situ. Multiple cycles of surface modification and isotropic removal are performed with nano-scale selectivity with short process times. Fast pulsed thermal ALE is performed in a single processing chamber without a thermal budget problem.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate processing system comprising:
a processing chamber;
a substrate support disposed in the processing chamber and configured to support a substrate;
a heat source configured to heat the substrate;
a gas delivery system configured to supply a first process gas to the processing chamber; and
a controller configured to control the gas delivery system and the heat source to iteratively perform an isotropic atomic layer etch process including
during an iteration of the isotropic atomic layer etch process, performing pretreatment, atomistic adsorption, and pulsed thermal annealing,
during the atomistic adsorption, exposing a surface of the substrate to the first process gas including a halogen species that is selectively adsorbed onto an exposed material of the substrate to form a modified material, wherein the halogen species comprises a halogen gas, and
during the pulsed thermal annealing, pulsing the heat source on and off a plurality of times within a predetermined period to expose and remove the modified material.

2. The substrate processing system of claim 1, wherein the controller is configured to, during iterations of the pulsed thermal annealing, allow the modified material to cool between consecutive ones of thermal energy pulses of the heat source.

3. The substrate processing system of claim 1, wherein the heat source includes a plurality of flash lamps.

4. The substrate processing system of claim 3, further comprising a capacitive discharge circuit configured to discharge power to the plurality of flash lamps for each of a plurality of thermal energy pulses of the heat source.

5. The substrate processing system of claim 3, wherein the heat source includes a reflector having parabolic reflective portions respectively for the plurality of flash lamps.

6. The substrate processing system of claim 3, wherein the plurality of flash lamps include respective cooling jackets.

7. The substrate processing system of claim 3, further comprising a reflector that is conical-shaped and directs thermal energy from the plurality of flash lamps at the substrate.

8. The substrate processing system of claim 3, wherein the controller is configured to pulse the plurality of flash lamps to be on for a pulse duration of less than 4 milliseconds during at least one iteration of the pulsed thermal annealing.

9. The substrate processing system of claim 1, wherein the controller is configured to, during at least some of the iterations of the pulsed thermal annealing and via the heat source, heat the modified material of the substrate such that the modified material of the substrate cools down to a temperature of less than 25° C. in less than 0.5 seconds after shutting off the heat source.

10. The substrate processing system of claim 1, wherein:
the heat source includes a laser; and
the laser is configured to generate a laser beam, which is directed at the substrate.

11. The substrate processing system of claim 10, further comprising:
a plurality of mirrors; and
a plurality of motors,
wherein the controller is configured, via the plurality of motors, to steer the laser beam by moving the mirrors to span across the substrate.

12. The substrate processing system of claim 11, wherein:
a diameter of the substrate is 300 mm;
the substrate includes a plurality of dies; and
the controller is configured to, within the predetermined period, span across and heat each of the plurality of dies.

13. The substrate processing system of claim 12, wherein:
the predetermined period is one second; and
the controller is configured to heat each of the plurality of dies individually and a second predetermined number of times.

14. The substrate processing system of claim 10, further comprising a lens circuit configured to shape and direct the laser beam.

15. The substrate processing system of claim 14, wherein the lens circuit includes beam-shaping optics to convert the laser beam from a round-shaped laser beam to a square-shaped laser beam.

16. The substrate processing system of claim 14, wherein the lens circuit comprises:
flat-top optics to convert the laser beam from a round-shaped laser beam to a flat-top shaped laser beam; and
diffractive optics to convert the flat-top shaped laser beam to a square-shaped laser beam.

17. The substrate processing system of claim 10, further comprising a mirror module comprising a first mirror, a second mirror, a first motor and a second motor,
wherein the controller is configured to move the first mirror and the second mirror via the first motor and the second motor to adjust a position of the laser beam on the substrate.

18. The substrate processing system of claim 10, further comprising a tele-centric lens assembly comprising a plurality of lenses and configured to direct the laser beam in a direction perpendicular to the surface of the substrate.

19. The substrate processing system of claim 18, further comprising a mirror module comprising a first mirror, a second mirror, a first motor and a second motor, wherein:
the laser beam is directed at the first mirror;
the laser beam is directed from the first mirror to the second mirror;
the laser beam is directed from the second mirror through the tele-centric lens assembly at the substrate; and
the controller is configured to move the first mirror and the second mirror via the first motor and the second motor to adjust a position of the laser beam on the substrate.

20. The substrate processing system of claim 19, wherein:
the processing chamber is an inductively coupled plasma chamber or a remote plasma source connected chamber; and
the tele-centric lens assembly is disposed above a dielectric window of the processing chamber.

21. The substrate processing system of claim 10, further comprising a beam size adjustment module configured to adjust a size of the laser beam prior to being received by the substrate.

22. The substrate processing system of claim 1, wherein the processing chamber is void of plasma during the pulsed thermal annealing.

23. The substrate processing system of claim 1, wherein the controller is configured to set a temperature of an interior of the processing chamber, during one or more iterations of the atomistic adsorption, to be less than or equal to 20° C. or equal to an ambient temperature.

24. The substrate processing system of claim 1, wherein the controller is configured to control the heat source to generate a plurality of thermal energy pulses to heat the modified material of the substrate without heating at least one of a base or a bulk portion of the substrate.

25. The substrate processing system of claim 1, wherein the controller is configured to supply the first process gas to the processing chamber to perform the atomistic adsorption on the exposed material of the substrate between each consecutive pair of thermal energy pulses of the heat source.

26. The substrate processing system of claim 25, wherein the controller is configured to modify, during the pretreatment, the substrate by subjecting the substrate to a second process gas.

27. The substrate processing system of claim 1, wherein the controller is configured to pulse the heat source to generate a plurality of thermal energy pulses within one second.

28. The substrate processing system of claim 1, wherein:
the pretreatment includes introduction of a second process gas;
the second process gas includes one or more of hydrogen and ammonia;
the halogen species includes one or more of oxygen, chlorine, iodine and fluorine;
the pulsed thermal annealing includes at least one of removal of a monolayer from the substrate or selectively removing silicon without removing germanium; and
the monolayer includes one or more of germanium, silicon, titanium and silicon dioxide.

29. The substrate processing system of claim 1, wherein the halogen gas comprises at least one of chlorine gas ($Cl_2$), iodine gas ($I_2$), fluorine gas ($F_3$), and bromine gas ($Br_2$).

30. The substrate processing system of claim 1, wherein the halogen gas comprises at least one of chlorine gas ($Cl_2$) and iodine gas ($I_2$).

31. The substrate processing system of claim 1, wherein the halogen gas comprises fluorine gas ($F_3$).

32. The substrate processing system of claim 1, wherein the pulsed thermal annealing includes selective removal of silicon and not removal of germanium.

* * * * *